United States Patent
Park et al.

(10) Patent No.: US 8,614,498 B2
(45) Date of Patent: Dec. 24, 2013

(54) HIGHLY INTEGRATED SEMICONDUCTOR DEVICES INCLUDING CAPACITORS

(75) Inventors: Dongkyun Park, Suwon-si (KR); Mansug Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/360,957

(22) Filed: Jan. 30, 2012

(65) Prior Publication Data

US 2012/0193761 A1 Aug. 2, 2012

(30) Foreign Application Priority Data

Jan. 31, 2011 (KR) ........................ 10-2011-0009485

(51) Int. Cl.
*H01L 29/92* (2006.01)

(52) U.S. Cl.
USPC ......................................................... 257/532

(58) Field of Classification Search
USPC .......................................... 257/532, E29.342
See application file for complete search history.

(56) References Cited

U.S. PATENT DOCUMENTS

| | | | | |
|---|---|---|---|---|
| 6,319,788 | B1* | 11/2001 | Gruening et al. ............. | 438/386 |
| 6,362,012 | B1* | 3/2002 | Chi et al. ........................... | 438/3 |
| 6,853,003 | B2* | 2/2005 | Lee .................................. | 257/68 |
| 7,244,649 | B2* | 7/2007 | Lee et al. ...................... | 438/253 |
| 8,299,574 | B2* | 10/2012 | Plum .............................. | 257/532 |
| 2004/0029342 | A1* | 2/2004 | Wu ................................. | 438/239 |
| 2004/0104451 | A1* | 6/2004 | Ooi et al. ....................... | 257/532 |
| 2004/0192008 | A1 | 9/2004 | Matsunuma | |
| 2005/0250290 | A1* | 11/2005 | Temmler ........................ | 438/387 |
| 2005/0266636 | A1* | 12/2005 | Kitamura et al. .............. | 438/241 |
| 2006/0060907 | A1* | 3/2006 | Kim et al. ....................... | 257/303 |
| 2006/0115950 | A1* | 6/2006 | Kim et al. ....................... | 438/381 |
| 2006/0156521 | A1* | 7/2006 | Miura et al. ................... | 29/25.03 |
| 2006/0157766 | A1* | 7/2006 | Won et al. ...................... | 257/296 |
| 2006/0234443 | A1* | 10/2006 | Yang et al. ..................... | 438/253 |
| 2006/0237762 | A1* | 10/2006 | Park ............................... | 257/306 |
| 2006/0255427 | A1* | 11/2006 | Giraudin et al. ............... | 257/532 |
| 2006/0270155 | A1* | 11/2006 | Hong .............................. | 438/253 |
| 2007/0128795 | A1* | 6/2007 | Kim et al. ...................... | 438/253 |
| 2007/0170487 | A1* | 7/2007 | Heitmann et al. ............. | 257/308 |
| 2007/0202657 | A1* | 8/2007 | Sun et al. ....................... | 438/396 |
| 2007/0235786 | A1* | 10/2007 | Kapteyn et al. ............... | 257/301 |
| 2008/0042240 | A1* | 2/2008 | Jon et al. ........................ | 257/534 |
| 2008/0070361 | A1* | 3/2008 | Yoon et al. .................... | 438/256 |
| 2008/0186648 | A1* | 8/2008 | Choi et al. ..................... | 361/305 |
| 2008/0217672 | A1* | 9/2008 | Popp et al. ..................... | 257/305 |
| 2009/0072290 | A1* | 3/2009 | Cheng et al. .................. | 257/303 |
| 2009/0152677 | A1* | 6/2009 | Horikawa ...................... | 257/532 |
| 2009/0221127 | A1* | 9/2009 | Iijima ............................ | 438/396 |

(Continued)

FOREIGN PATENT DOCUMENTS

| | | |
|---|---|---|
| JP | 2004-296802 | 10/2004 |
| KR | 1020050058578 A | 6/2006 |
| KR | 1020080055215 A | 6/2008 |

*Primary Examiner* — Thao P. Le

(74) *Attorney, Agent, or Firm* — Myers Bigel Sibley & Sajovec

(57) ABSTRACT

A capacitor of semiconductor device is provided including a lower electrode on a semiconductor substrate; a dielectric film covering a surface of the lower electrode; and an upper electrode covering the dielectric film. The lower electrode includes a first conductive pattern having a groove region defined by a bottom portion and a sidewall portion; and a first core support pattern disposed in the groove region of the first conductive pattern and exposing a portion of inner sidewall of the first conductive pattern. Related methods are also provided herein.

18 Claims, 23 Drawing Sheets

(56) References Cited

U.S. PATENT DOCUMENTS

| | | | |
|---|---|---|---|
| 2009/0289292 A1* | 11/2009 | Park | 257/306 |
| 2010/0001325 A1* | 1/2010 | Sashida | 257/295 |
| 2010/0078697 A1* | 4/2010 | Sugino | 257/296 |
| 2010/0301436 A1* | 12/2010 | Sashida | 257/421 |
| 2011/0116210 A1* | 5/2011 | Nakayama | 361/301.4 |
| 2011/0159660 A1* | 6/2011 | Kang et al. | 438/381 |

* cited by examiner

HIGHLY INTEGRATED SEMICONDUCTOR DEVICES INCLUDING CAPACITORS

CROSS-REFERENCE TO RELATED APPLICATION

This U.S. non-provisional patent application claims priority under 35 U.S.C. §119 of Korean Patent Application No. 10-2011-0009485, filed on Jan. 31, 2011, the entire contents of which are hereby incorporated herein by reference as if set forth in its entirety.

FIELD

The present inventive concept relates generally to semiconductor devices and, more particularly, to highly integrated semiconductor devices including capacitors.

BACKGROUND

As semiconductor device become more highly integrated, a capacitor having sufficient capacitance in a limited area is required. The capacitance of a capacitor is proportional to a surface area of an electrode and a dielectric constant of dielectric film and is inversely proportional to an equivalent oxide thickness of the dielectric film. In methods for increasing the capacitance of capacitor in a limited area, a surface area of electrode may be increased by forming a capacitor of a three dimensional structure, an equivalent oxide thickness of dielectric film may be reduced and a dielectric film having a high dielectric constant may be used.

In methods that increase the surface area of electrode, a height of lower electrode (or a storage electrode) may be increased, an effective surface area of lower electrode using a hemi-spherical grain (HSG) may be enlarged and an inside area and an outside area of cylinder using one cylinder storage (OCS) electrode may be used. As a dielectric film having a high dielectric constant, there may be a metal oxide film such as $TiO_2$ and $Ta_2O_5$ or a ferroelectric of perovskite structure.

SUMMARY

Some embodiments of the inventive concept provide a capacitor of a semiconductor device. The capacitor may include a lower electrode on a semiconductor substrate; a dielectric film covering a surface of the lower electrode; and an upper electrode covering the dielectric film. The lower electrode may include a first conductive pattern having a groove region defined by a bottom portion and a sidewall portion; and a first core support pattern disposed in the groove region of the first conductive pattern and exposing a portion of inner sidewall of the first conductive pattern.

Further embodiments of the inventive concept provide a capacitor of a semiconductor device. The capacitor includes a lower electrode on a semiconductor substrate; a dielectric film covering a surface of the lower electrode; and an upper electrode covering the dielectric film. The lower electrode may include a first conductive pattern having a groove region defined by a bottom portion and a sidewall portion; a first core support pattern filling the groove region of the first conductive pattern; a second conductive pattern disposed on the first conductive pattern and the first core support pattern and having a groove region defined by a bottom portion and a sidewall portion; and a second core support pattern disposed in the groove region of the second conductive pattern and exposing a portion of inner sidewall of the second conductive pattern.

BRIEF DESCRIPTION OF THE FIGURES

The foregoing and other features and advantages of the present inventive concept will be apparent from the more particular description of preferred aspects of the inventive, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION

Figure 1:
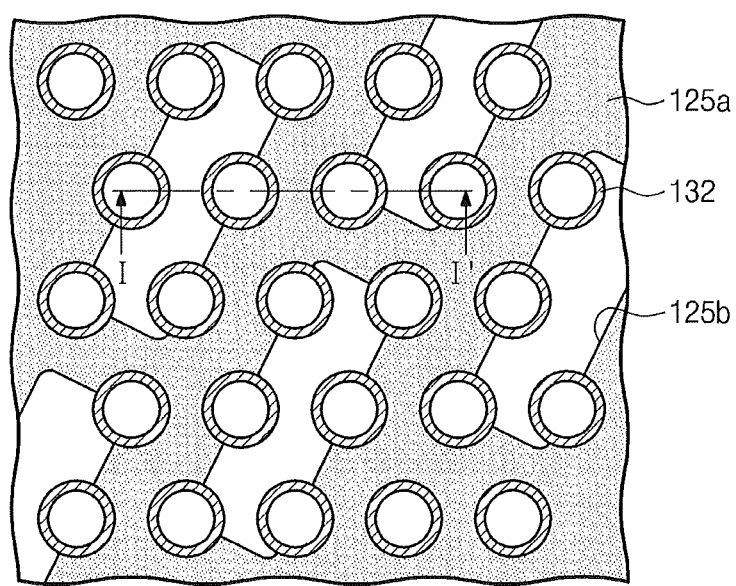
FIG. 1 is a plan view illustrating a semiconductor device in accordance with some embodiments of the inventive concept.

Embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

In the drawings, the thickness of layers and regions are exaggerated for clarity. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the inventive concept may be described with reference to cross-sectional illustrations, which are schematic illustrations of idealized embodiments of the present inventive concept. As such, variations from the shapes of the illustrations, as a result, for example, of manufacturing techniques and/or tolerances, are to be expected. Thus, embodiments of the present inventive concept should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present inventive concept.

Figure 2:
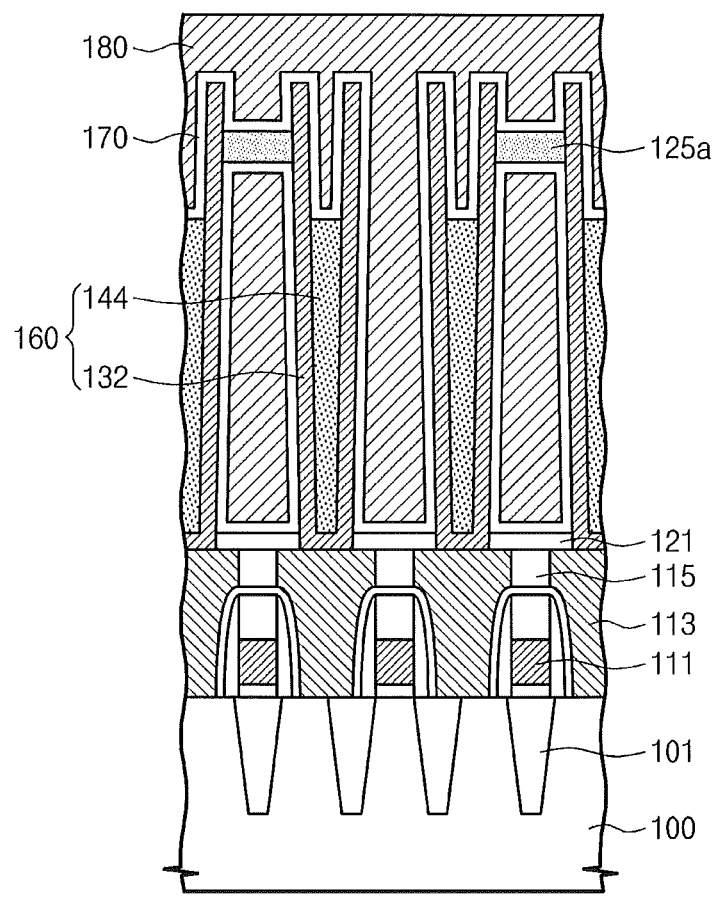
FIG. 2 is a cross section illustrating a semiconductor device in accordance with some embodiment of the inventive concept, which is taken along the line I-I' of FIG. 1.

FIG. 1 is a plan view illustrating a semiconductor device in accordance with some embodiments of the inventive concept. FIG. 2 is a cross-section taken along the line I-I' of FIG. 1 illustrating a capacitor of a semiconductor device in accordance with some embodiments of the inventive concept. Referring now to FIGS. 1 and 2, a capacitor of semiconductor device may include a lower electrode 160, a dielectric film 170 and an upper electrode 180. The lower electrode 160 of the capacitor may be electrically connected to a switching device.

More specifically, switching devices, for example, MOS transistors, may be formed on a semiconductor substrate 100 in which an active region is defined by a device isolation film 101. For example, a MOS transistor which is a switching device may include a gate electrode and source/drain electrodes. More specifically, a plurality of conductive lines (gate lines or bit lines) may be disposed on the semiconductor substrate 100 and the source/drain electrodes may be formed in the semiconductor substrate 100 between the conductive lines. The conductive lines 111 may be isolated by an insulating material and a contact plug 113 may be electrically connected to each of the source/drain electrodes.

The lower electrode 160 of capacitor may be disposed on an interlayer insulating film 115 including the contact plugs 113 and may be electrically connected to the contact plug 113. Since capacitance of capacitor is in proportion to a surface area of the lower electrode 160, capacitance of capacitor may be increased by increasing a height of the lower electrode 160. According to some embodiments, a height of the lower electrode 160 may be from about 5000 Å to about 15,000 Å without departing from the scope of the present inventive concept.

As a height of the lower electrode 160 formed in a limited area increases, an aspect ratio of the lower electrode 160 increases. Thus, a support pattern 125a supporting the lower electrode 160 horizontally may be connected to the circumference of the lower electrode 160 to reduce the likelihood or, possibly prevent, the lower electrode 160 from being bent or being collapsed. The support pattern 125a, as illustrated in FIG. 1, may surround the lower electrodes 160 (i.e., a conductive pattern 132) but may have openings 125b in predetermined regions. The support pattern 125a may be formed from an insulating material such as a silicon nitride film. Further, according to some embodiments, a core support pattern 144 supporting the lower electrode 160 vertically may be included to reduce the likelihood, or possibly prevent, the lower electrode 160 from being bent or being collapsed.

In particular, the lower electrode 160 in accordance with some embodiments may include the conductive pattern 132 and the core support pattern 144. The conductive pattern 132 may have a cylindrical shape having a bottom portion and a sidewall portion defining a groove region. The bottom portion and the sidewall portion of the lower electrode 160 may have a same thickness and the lower electrode 160 may have a gradually narrowing width as the lower electrode 160 approaches a lower portion. In other words, a lower width of the lower electrode 160 is less than an upper width of the lower electrode 160.

The conductive pattern 132 may include metal material. The conductive pattern 132 may be formed of a metal film such as cobalt (Co), titanium (Ti), nickel (Ni), tungsten (W), molybdenum (Mo), platinum (Pt), ruthenium (Ru) and iridium (Ir), a metal nitride film such as a titanium nitride film (TiN), a titanium silicon nitride film (TiSiN), a titanium aluminum nitride film (TiAlN), a tantalum nitride film (TaN), a tantalum silicon nitride film (TaSiN), a tantalum aluminum nitride film (TaAlN) and a tungsten nitride film (WN), a conductive noble metal oxide film such as PtO, $RuO_2$ or $IrO_2$ and a conductive oxide film such as SRO($SrRuO_3$), BSRO ((Ba, Sr)$RuO_3$), CRO($CaRuO_3$) or LSCo. According to some embodiments, the conductive pattern 132 may be formed of a titanium nitride film.

According to some embodiments, the core support pattern 144 may fill a portion of the groove region of the conductive pattern 132. That is, an upper surface of the core support pattern 144 is located lower than an upper surface of the conductive pattern 132 to expose a portion of an inner sidewall of the conductive pattern 132. In some embodiments, a height of the core support pattern 144 may be half of a height of the conductive pattern 132. More specifically, a height of the core support pattern 144 may be 0.5 to 1.0 times the height of the conductive pattern 132. Since a portion of inner sidewall of the conductive pattern 132 is exposed by the core support pattern 144, a surface area of the lower electrode 160 may be increased.

The core support pattern 144 formed at the center of the conductive pattern 132 may be formed of material having superior stiffness, i.e., mechanical strength, as compared with the conductive pattern 132. In particular, the core support pattern 144 may be formed of material having an elastic modulus larger than the conductive pattern 132. More specifically, the core support pattern 144 may be formed of material having Young's modulus of about 300 Gpa through 1000 Gpa. Also, the core support pattern 144 may be formed of material having an etching selectivity with respect to the consecutive pattern 132.

For example, the core support pattern 144 may be formed of at least one selected from the group consisting of tungsten (W), iridium (Ir), ruthenium (Ru), aluminum oxide ($Al_2O_3$), ruthenium oxide ($RuO_2$) or combinations thereof. In another embodiment, the core support pattern 144 may be formed of at least one selected from the group consisting of silicon oxide, silicon nitride, silicon carbide (SiC), silicon oxycarbide (SiOC), SiLK, a black diamond, CORAL, BN, an anti-reflective coating (ARC) film or combinations thereof.

A dielectric film 170 and an upper electrode 180 may be sequentially formed on the lower electrode 160 comprised of the conductive pattern 132 and the core support pattern 144.

The dielectric film 170 may be formed on a surface of the lower electrodes 160 at a uniform thickness. In some embodiments, since the core support pattern 144 fills a portion of groove region of the conductive pattern 132, the dielectric film 170 may cover an upper surface of the core support pattern 144 and a portion of inner sidewall of the conductive pattern 132 exposed by the core support pattern 144. For example, the dielectric film 170 may be formed of any single film selected from the group consisting of metal oxide such as $HfO_2$, $ZrO_2$, $Al_2O_3$, $La_2O_3$, $Ta_2O_3$ and $TiO_2$ and a dielectric material of perovskite structure such as $SrTiO_3$(STO), (Ba, Sr)$TiO_3$(BST), $BaTiO_3$, PZT and PLZT or combinations thereof. The dielectric film 170 may have a thickness of from about 50 Å to about 150 Å.

The upper electrode 180 may be formed on the dielectric film 170 to cover a plurality of lower electrodes 160. Further, the upper electrode 180 may fill a portion of groove region of the conductive pattern 132 on which the dielectric film 170 is formed. For example, the upper electrode 180 may include at least one of silicon doped with an impurity, metal material, metal nitride films and metal silicide. For example, the upper electrode 180 may be formed of a refractory metal film such as cobalt, titanium, nickel, tungsten and molybdenum. The upper electrode 180 may be formed of a metal nitride film such as a titanium nitride film (TiN), a titanium silicon nitride film (TiSiN), a titanium aluminum nitride film (TiAlN), a tantalum nitride film (TaN), a tantalum silicon nitride film (TaSiN), a tantalum aluminum nitride film (TaAlN) and a tungsten nitride film (WN). Also, the upper electrode 180 may be formed of at least one noble metal film selected from the group consisting of platinum (Pt), ruthenium (Ru) and iridium (Ir). The upper electrode 180 may also be formed of a conductive noble metal oxide film such as PtO, $RuO_2$ or $IrO_2$ and a conductive oxide film such as SRO($SrRuO_3$), BSRO ((Ba, Sr)$RuO_3$), CRO((Ca$RuO_3$) or LSCo.

Figure 3:
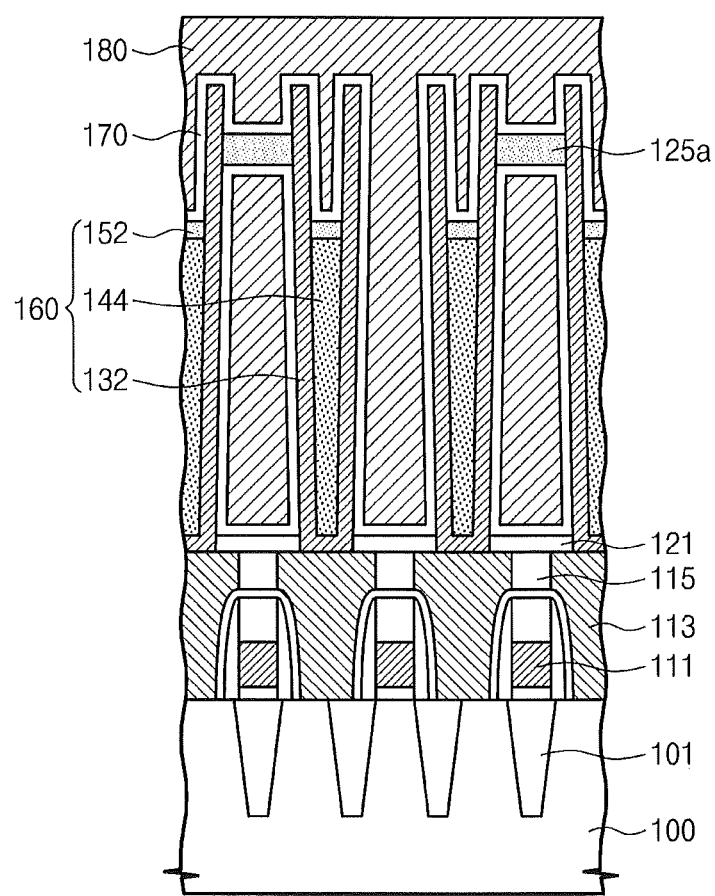
FIGS. 3 and 4 are cross sections illustrating semiconductor devices in accordance with some embodiments of the present inventive concept.
Figure 4:
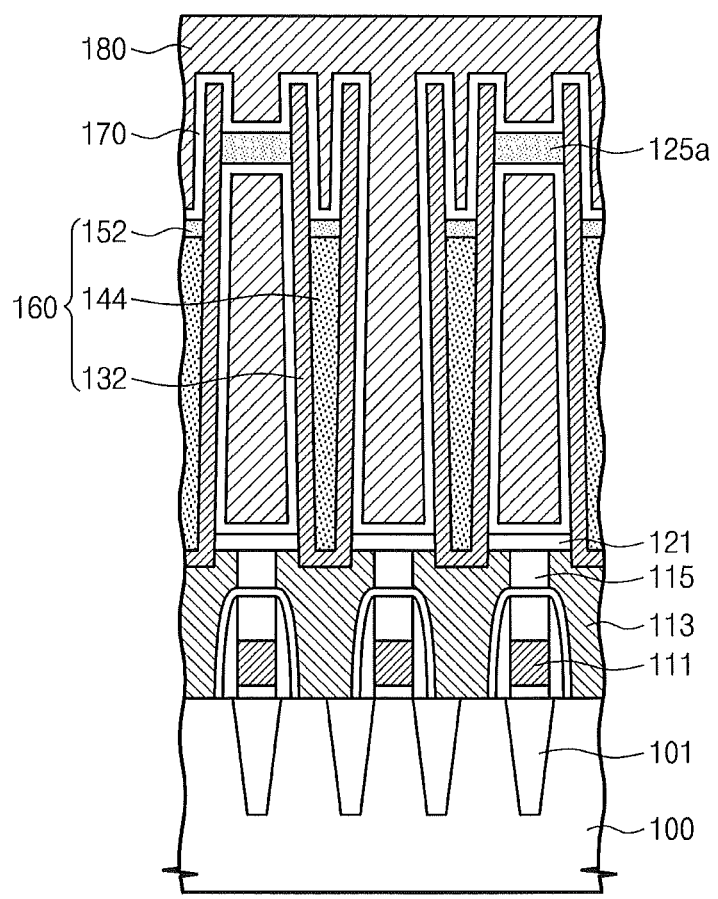

FIGS. 3 and 4 are cross sections illustrating examples of some embodiments of the present inventive concept. Hereinafter, the modified examples are described with reference to FIGS. 3 and 4. Also, as discussed above, like referenced numerals discussed above correspond to like elements illustrated in FIGS. 3 and 4. Thus, in the interest of brevity, the details thereof will be omitted.

According to embodiments illustrated in FIG. 3, the lower electrode 160 may further include a barrier pattern 152 interposed between the core support pattern 144 and the dielectric film 170. That is, the core support pattern 144 may be spaced apart from the dielectric film 170 by the barrier pattern 152.

In embodiments where the core support pattern 144 includes metal atoms, the barrier pattern 152 may be formed of conductive material that can reduce or, possibly minimize, a diffusion of metal atoms in the core support pattern 144 into the dielectric film 170. For example, in embodiments where the core support pattern 144 is formed of tungsten, because a deposition gas including florin (F) like WF6 is used to form the core support pattern 144, tungsten (W) may contain florin (F). Herein, the barrier pattern 152 may reduce the likelihood or, possibly prevent, florin (F) from attacking the dielectric film 170 on the core support pattern 144. For example, the barrier pattern 152 may include conductive metal nitride, for example, titanium nitride, tantalum nitride or tungsten nitride. In addition, the barrier pattern 152 may further include transition metal, for example, titanium or tantalum, interposed between the conductive metal nitride and the core support pattern 144.

According to embodiments illustrated in FIG. 4, a lower portion of the lower electrode 160 may be inserted into the contact plug 113 to reduce the likelihood, or possibly prevent, collapse of the lower electrode 160. In other words, a bottom surface of the conductive pattern 132 may be located at a position lower than an upper surface of the interlayer insulating film 115.

Figure 5A:
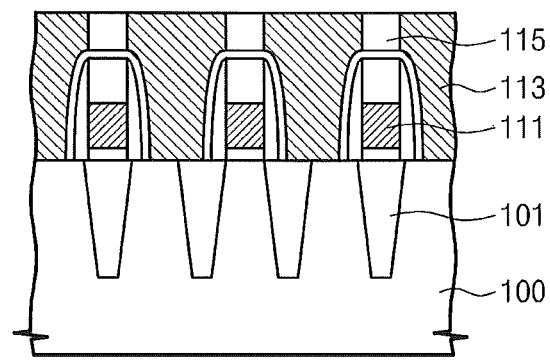
FIGS. 5A through 5H are cross sections illustrating processing steps in the fabrication of semiconductor devices in accordance with the some embodiments of the inventive concept.

FIGS. 5A through 5H are cross sections illustrating processing steps in the fabrication of semiconductor devices in accordance with some embodiments of the inventive concept. Referring to FIG. 5A, a plurality of MOS transistors is formed on a semiconductor substrate 100 in which an active region is defined by a device isolation film 101. Forming the MOS transistors may include forming gate lines 111, i.e., conductive lines, and forming source/drain electrodes in an active region between the gate lines 111.

More specifically, the semiconductor substrate 100 may be a bulk silicon substrate, a silicon-on-insulator (SOI) substrate, a germanium substrate, a germanium-on-insulator (GOI) substrate, a silicon-germanium substrate or an epitaxial film substrate obtained by performing a selective epitaxial growth (SEG).

According to some embodiments, a plurality of gate lines 111 crossing active regions may be formed on the semiconductor substrate 100. According to further embodiments, a plurality of gate lines 111 may be disposed on the semiconductor substrate 100, and bit lines crossing the gate lines 111 may be disposed on the plurality of gate lines 111. According to further embodiments, a plurality of gate lines 111 may be recessed to a predetermined depth from an upper surface of the semiconductor substrate 100 and a plurality of bit lines may be disposed on the semiconductor substrate 100. According to still further embodiments, transistors having a vertical channel may be formed on the semiconductor substrate 100. In these embodiments, bit lines may cross sidewalls of a plurality of gate lines.

Subsequently, an interlayer insulating film 115 covering the conductive lines 111 may be formed on the semiconductor substrate 100. More specifically, the interlayer insulating film 115 may include of at least one insulating film and the insulating film may be formed of a material having a superior gap fill characteristic. For example, the insulating film may be formed of a boron-phosphor silicate glass (BPSG) film, a high density plasma (HDP) oxide film, a tetra ethyl ortho silicate (TEOS) film, an undoped silicate glass or a tonen silazene (TOSZ) material. The interlayer insulating film 115 may be formed using a film-formation technology having a superior property of step coverage such as a chemical vapor deposition (CVD) or an atomic layer deposition (ALD). After depositing the interlayer insulating film 115, an upper portion of the interlayer insulating film 115 may be planarized by performing a chemical mechanical polishing (CMP) or an etch-back process. Before forming the interlayer insulating film 115, an etch-stop film conformally covering the structures formed on the semiconductor substrate 100 may be formed.

Contact plugs 113 electrically connected to source/drain electrodes of MOS transistor may be formed in the interlayer insulating film 115. The contact plugs 113 may be formed by patterning the interlayer insulating film 115 to form contact holes, and then filling the contact holes with conductive material. More specifically, a photolithography etching process may be performed on the interlayer insulating film 115 to form contact holes exposing source/drain electrodes formed in the semiconductor substrate 100. Filling the contact holes with conductive material may include depositing conductive film in the contact hole, and then planarizing the conductive film. Herein, the conductive film may be formed of at least one of a polysilicon film, a metal film, a metal nitride film and a metal silicide film.

Figure 5B:
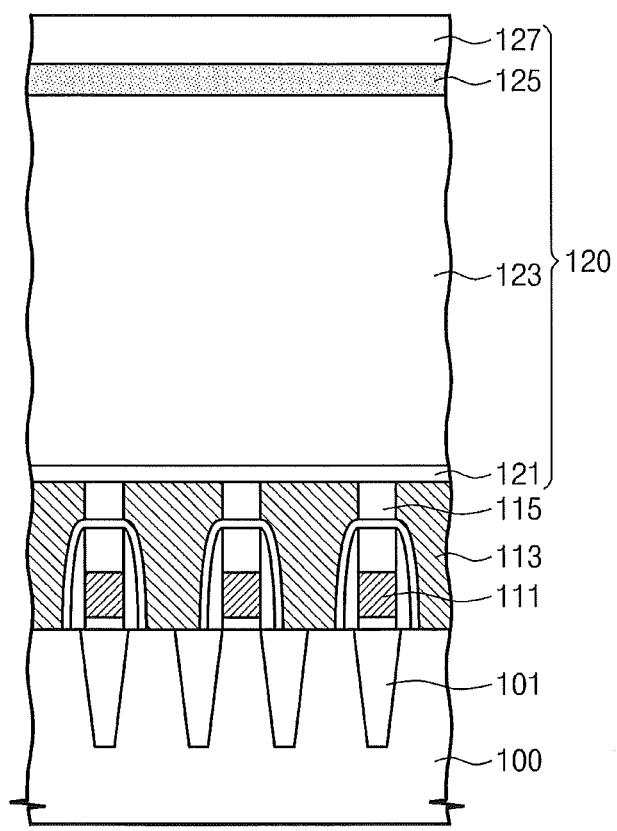

Referring to FIG. 5B, a first mold layer 120 may be formed on the interlayer insulating film 115 in which the contact plugs 113 are formed. In a formation of capacitor, a height of a lower electrode may be changed depending on a thickness of the first molding layer 120 and capacitance of a capacitor may be changed depending on a height of the lower electrode. That is, as a height of the lower electrode increases, capacitance of a capacitor may increase. For example, the first mold layer 120 may have a thickness of from about 5000 Å to about 15000 Å.

According to some embodiments, the first mold layer 120 may include of a lower insulating film 123, a first support film 125 and an upper insulating film 127. According to further embodiments, the first support film 125 may be omitted and the first mold layer 120 may be comprised of one or a plurality of insulating films.

The lower insulating film 123 and the upper insulating film 127 may be formed of borosilicate glass (BSG), phosphosilicate glass (PSG), borophosphosilicate glass (BPSG), tetra ethyl ortho silicate (TEOS) or a silicon oxide film such as an undoped silicate glass (USG) film, a spin on glass (SOG) film and a flowable oxide (FOX) film. The first support film 125 may be formed of material having an etching selectivity with respect to the lower and upper insulating films 123 and 127 in a process of performing a wet etching on the lower and upper insulating films 123 and 127. For example, the first support film 125 may be formed of a silicon nitride film, a silicon carbon nitride film or a silicon oxynitride film and may have a thickness of from about 100 Å to about 1000 Å.

According to some embodiments, before forming the lower insulating film 123, an etch-stop film 121 being used as an etching end point when patterning the first mold layer 120 may be formed. The etch-stop film 121 may have a thickness of from about 100 Å to about 500 Å and may be formed of a silicon nitride film or a silicon oxynitride film.

Figure 5C:
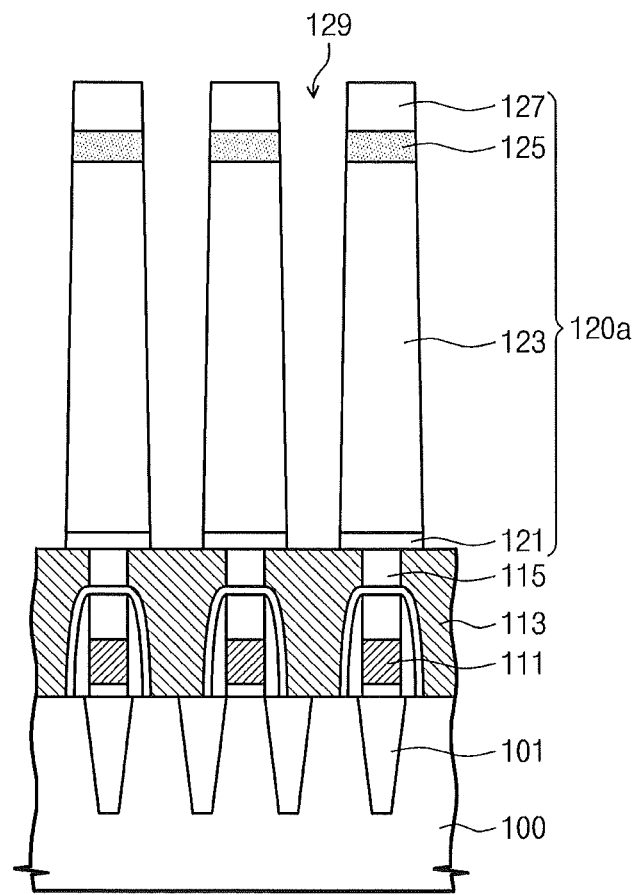

Referring to FIG. 5C, the first mold layer 120 is patterned to form first openings 129 exposing the contact plug 113. To form the first openings 129 penetrating the thick first mold layer 120, while etching the first mold layer 120, a hard mask pattern having a superior etching selectivity with respect to the first mold layer 120 is required. To achieve this, the hard mask pattern may be formed of amorphous carbon and/or polysilicon. The first openings 129 may be formed by anisotropically etching the first mold layer 120 and the etch-stop film 121 using the hard mask pattern on the first mold layer 120 as an etching mask. By the anisotropic etching process, the first opening 129 may have a gradually narrowing width as the first opening 129 approaches a lower portion. That is, the first openings 129 may have a inclined sidewall. Also, when anisotropically etching the first mold layer 120, the etch-stop film 121 is removed by an over etching and thereby an upper surface of the contact plug 113 may be exposed. An upper surface of the contact plug 113 may be recessed by an anisotropic etching process forming the first openings 129.

Figure 5D:
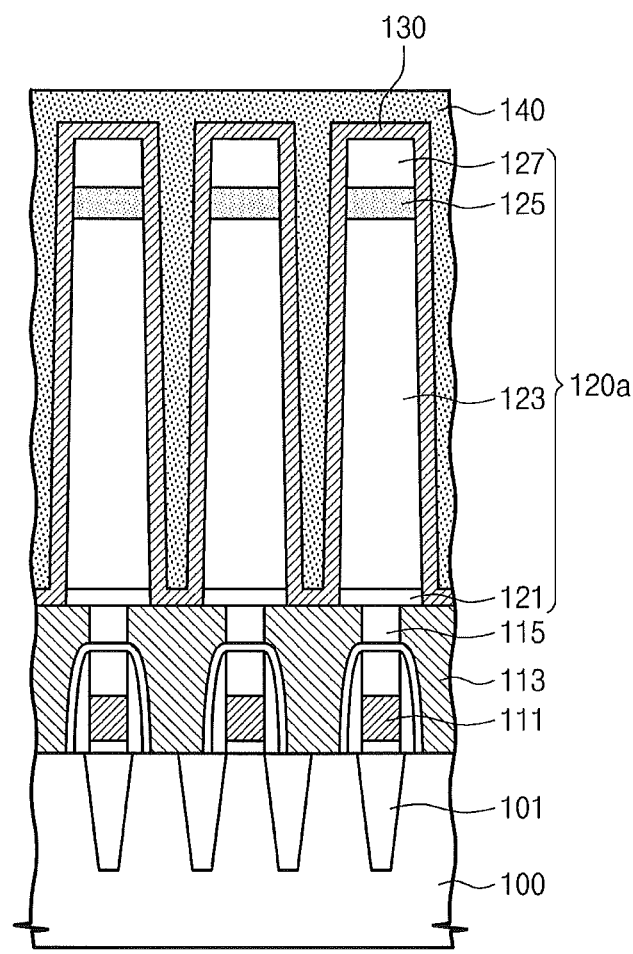

Referring to FIG. 5D, a first conductive film 130 and a core support film 140 are sequentially formed on the first mold layer 120 in which the first mold layer 120 is formed. The first conductive film 130 and the core support film 140 may be formed using a film-formation technology having a superior property of step coverage such as a chemical vapor deposition (CVD) or an atomic layer deposition (ALD).

More specifically, the first conductive film 130 may be formed to define a groove region in the first opening 129. To achieve this, the first conductive film 130 may be deposited to have a thickness of half a diameter of the first opening 129 or less. A thickness of a bottom portion covering an upper surface of the contact plug 113 may be the substantially same with a thickness of a sidewall portion covering an inner wall of the first opening 129. The core support film 140 may be deposited to have enough thickness to completely fill the first opening 129 in which the first conductive film 130 is formed. For example, the first conductive film 130 and the core support film 140 may be deposited to have a thickness of from about 10 Å to about 500 Å, respectively.

In some embodiments, the first conductive film 130 may include at least one of silicon doped with an impurity, metal materials, metal nitride films and metal silicides. For example, the first conductive film 130 may be formed of a refractory metal material such as cobalt, titanium, nickel, tungsten and molybdenum. The first conductive film 130 may be formed of a metal nitride film such as a titanium nitride film (TiN), a titanium silicon nitride film (TiSiN), a titanium aluminum nitride film (TiAlN), a tantalum nitride film (TaN), a tantalum silicon nitride film (TaSiN), a tantalum aluminum nitride film (TaAlN) and a tungsten nitride film (WN). Also, the first conductive film 130 may be formed of at least one noble metal film selected from the group consisting of platinum (Pt), ruthenium (Ru) and iridium (Ir). The first conductive film 130 may also be formed of a conductive noble metal oxide film such as PtO, $RuO_2$ or $IrO_2$ and a conductive oxide film such as $SRO(SrRuO_3)$, $BSRO((Ba, Sr)RuO_3)$, CRO $((CaRuO_3)$ or LSCo.

After depositing the first conductive film 130, a plasma process and a thermal annealing process for removing impurities generated when the first conductive film 130 is deposited may be performed. When performing a plasma process, $N_2$ plasma and $H_2$ plasma may be used.

The core support film 140 may be formed to fill the groove region defined by the first conductive film 130. In some embodiments, the core support film 140 may be formed of a material having an etching selectivity with respect to the first conductive film 130 and the first mold layer 120a.

The core support film 140 may be formed of material having an elastic modulus larger than the first conductive film 130 and an etching selectivity with respect to the first conducive film 130. That is, the core support film 140 may be formed of material having superior stiffness, i.e., mechanical strength, as compared with the conductive film 130. The core support film 140 may be formed of material having Young's modulus of about 300 Gpa through 1000 Gpa.

For example, the core support film 140 may be formed of at least one selected from the group consisting of tungsten (W), iridium (Ir), ruthenium (Ru), aluminum oxide ($Al_2O_3$), ruthenium oxide ($RuO_2$) or combinations thereof. In some embodiments, the core support film 140 may be formed of material selected from silicon doped with an impurity, metal materials, metal nitride films and metal silicides and having an etching selectivity with respect to the first conductive film 130. In further embodiments, the core support film 140 may be formed of at least one selected from the group consisting of silicon oxide, silicon nitride, silicon carbide (SiC), silicon oxycarbide (SiOC), SiLK, a black diamond, CORAL, BN, an anti-reflective coating (ARC) film or combinations thereof.

Figure 5E:
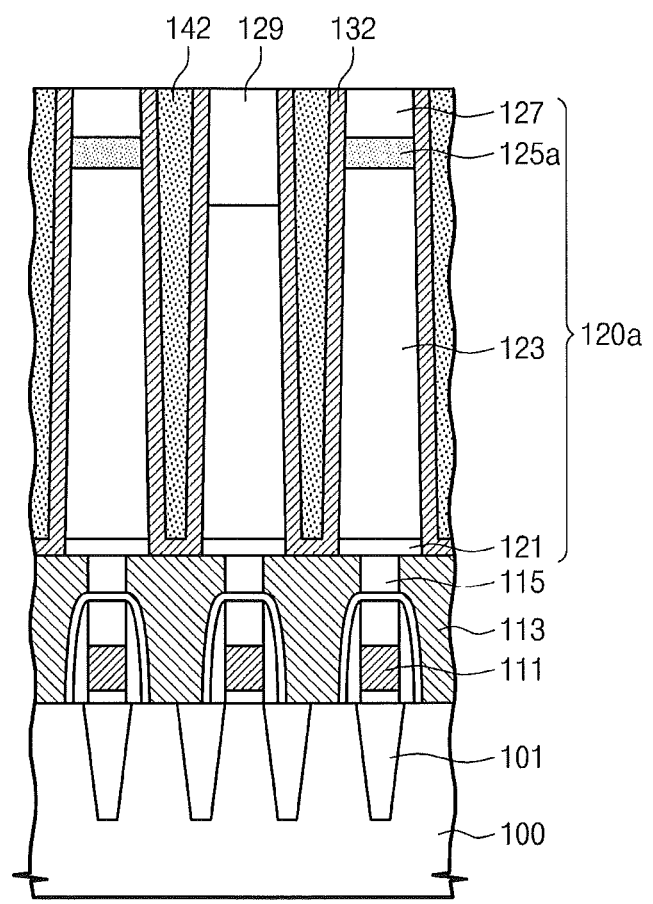

Referring to FIG. 5E, a planarization process is performed on the first conductive film 130 and the core support film 140 until an upper surface of the first mold layer 120a is exposed. A chemical mechanical polishing (CMP) or a dry etch-back process may be used as the planarization process. As the first conductive film 130 and the core support film 140 are planarized, as illustrated in FIG. 5E, a first conductive pattern 132 of cylindrical shape having a groove region may be formed in each of the first openings 129 and a core support pattern 142 may be formed in the groove region of the first conductive pattern 132.

After forming the first conductive patterns 132 and the core support patterns 142, a first support pattern 125a may be formed by patterning the first support film 125. More specifically, forming the first support pattern 125a may include forming mask patterns exposing a portion of the upper insulating film 127 on the first mold layer 120a in which the first conductive patterns 132 and the core support patterns 42 are formed and sequentially etching the upper insulating film 127 and the first support film 125 exposed by the mask patterns. As a result, the first support pattern 125a connected to the first conductive patterns 132 and exposing the lower insulating film 123 at predetermined regions may be formed. That is, the first support pattern 125a may expose the lower insulating film 123 while surrounding a portion of or the whole outer sidewall of the first conductive pattern 132. The first support pattern 125a formed by that method has an etching selectivity with respect to the upper and lower insulating films 123 and 127 in a subsequent process of removing the lower and upper insulating films 123 and 127, and the first support pattern 125a connects the adjacent first conductive patterns 132, thereby reducing the likelihood, or possibly preventing, the lower electrodes having a high aspect ratio from being collapsed. After forming the first support pattern 125a, an insulating film may be formed on the lower insulating film 123 exposed between the first conductive patterns 132.

Figure 5F:
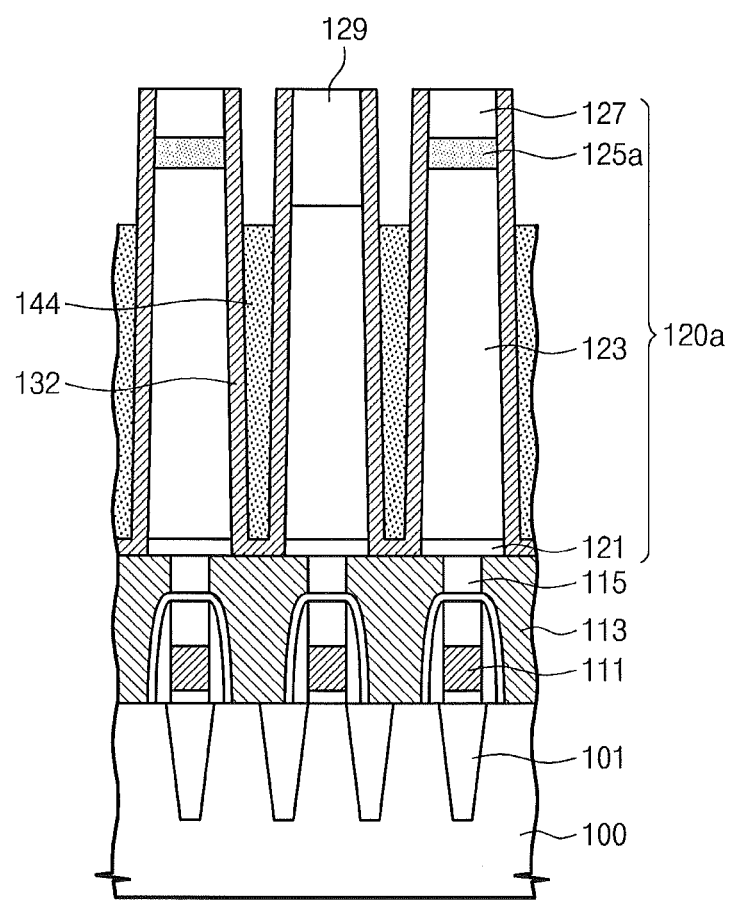

Referring to FIG. 5F, a portion of an inner sidewall of the first conductive pattern 132 is exposed by recessing an upper surface of the core support pattern 142 filling the groove region of the first conductive pattern 132. Recessing the core support pattern 142 may include isotropically or anisotropically etching an upper portion of the core support pattern 142 using a recipe having an etching selectivity with respect to the first conductive pattern 132. Herein, a recess depth of the core support pattern 144 may be 0.5 to 1 times the height of the first conductive pattern 132 to reduce the likelihood or, possibly prevent, the first conductive pattern 132 from being bent.

Figure 5G:
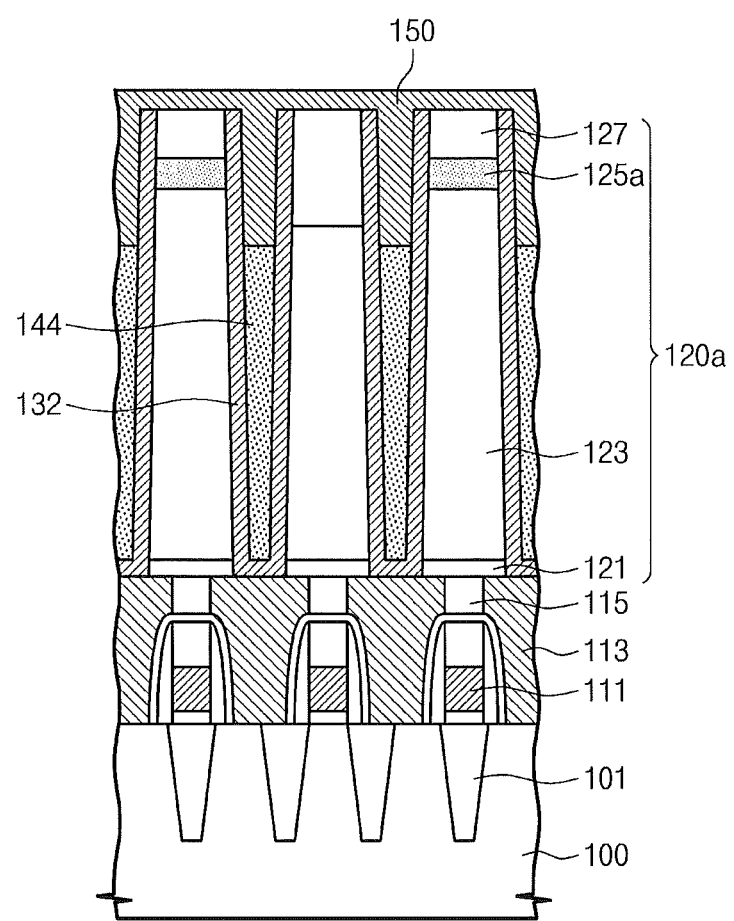
Figure 5H:
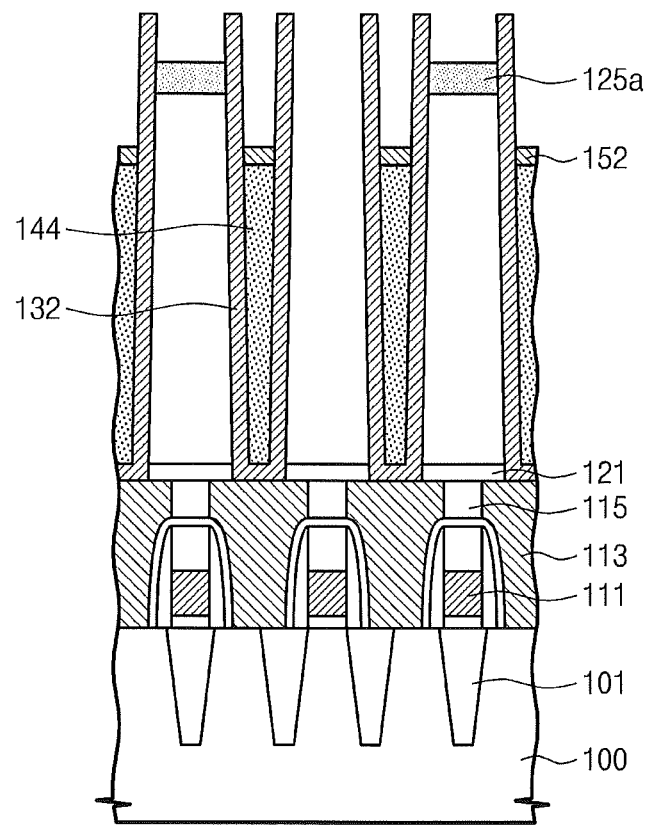

Referring to FIGS. 5G and 5H, a barrier pattern 152 may be formed on an upper surface of the recessed core support pattern 144. In some embodiments, forming the barrier pattern 152 may include forming a barrier film 150 on the recessed core support pattern 144 and locally forming the barrier pattern 152 on the core support pattern 144 by selectively etching the barrier film 150.

The barrier film 150 may be formed using a deposition method and may fully fill a groove region on the recessed core support pattern 144. The barrier film 150 may be formed of conductive material that can reduce or, possibly minimize, a diffusion of metal atoms in the core support pattern 144 into a dielectric film. For example, the barrier film 150 may be formed of conductive metal nitride (e.g., titanium nitride, tantalum nitride or tungsten nitride). In addition, the barrier film 150 may further include transition metal, for example, titanium or tantalum, interposed between the conductive metal nitride and the core support pattern 144.

An anisotropic etching method or an isotropic etching method may be used as a process of selectively etching the barrier film 150. Selectively etching the barrier film 150 may include exposing an upper surface of the first mold layer 120a by etching the barrier film 150 and successively etching a portion of the barrier film 150 in the groove region of the first conductive pattern 132 to locally leave the barrier film 150 in the groove region.

Referring to FIG. 5H, after forming the barrier pattern 152, a process of removing the first mold layer 120a that exposes an outer sidewall of the first conductive pattern 132 may be performed. According to some embodiments, a process of removing the first mold layer 120a without forming the barrier pattern 152.

More specifically, the process of removing the first mold layer 120a may include selectively etching the lower and upper insulating films 123 and 127. For example, embodiments where the lower and upper insulating films 123 and 127 are formed of a silicon oxide film, the lower and upper insulating films 123 and 127 may be removed by a wet etching process using an etching solution including hydrofluoric acid. In embodiments where the lower and upper insulating films 123 and 127 are formed of a silicon nitride film, the lower and upper insulating films 123 and 127 may be removed by a wet etching process using an etching solution including phosphoric acid. Also, in embodiments where the lower and upper insulating films 123 and 127 are formed of a film of polymer system, the lower and upper insulating films 123 and 127 may be removed by a dry etching process of oxygen atmosphere.

When removing the lower and upper insulating films 123 and 127, the first support patterns 125a having an etching selectivity with respect to the lower and upper insulating films 123 and 127 may remain without being removed. Thus, the first conductive patterns 132 may be connected to one another by the first support pattern 125a.

By removing the first mold layer 120a, a lower electrode of capacitor including the first conductive pattern 132 and the core support pattern 144 may be formed on each of the contact plugs 113. Herein, the core support pattern 144 may reduce the likelihood or, possibly prevent, the lower electrode having a high aspect ratio from being bent or being collapsed.

As illustrated in FIGS. 2 through 4, a dielectric film 170 is conformally formed along a surface of the lower electrode and an upper electrode 180 may be formed on the dielectric film 170. In some embodiments, as illustrated in the drawing, since the lower electrode may include the first conductive pattern 132, the core support pattern 144 and the barrier pattern 152, the dielectric film having a uniform thickness may be formed on a surface of the first conductive pattern 132 and on an upper surface of the core support pattern 144 exposed by removing the first mold layer 120a. As illustrated in FIG. 2, in embodiments where a barrier pattern is not formed on the core support pattern 144, the dielectric film 170 may be directly in contact with an upper surface of the core support pattern 144.

The dielectric film 170 and the upper electrode 180 may be formed using a film-formation technology having a superior property of step coverage such as a chemical vapor deposition (CVD), a physical vapor deposition (PVD) or an atomic layer deposition (ALD).

For example, the dielectric film 170 may be formed of any single film selected from the group consisting of metal oxide such as $HfO_2$, $ZrO_2$, $Al_2O_3$, $La_2O_3$, $Ta_2O_3$ and $TiO_2$ and a dielectric material of perovskite structure such as $SrTiO_3$ (STO), $(Ba, Sr)TiO_3$(BST), $BaTiO_3$, PZT and PLZT or combinations thereof. The dielectric film 170 may have a thickness of from about 50 Å to about 150 Å.

The upper electrode 180 may include at least one of silicon doped with an impurity, metal material, metal nitride films and metal silicide. For example, the upper electrode 180 may be formed of a refractory metal film such as cobalt, titanium, nickel, tungsten and molybdenum. The upper electrode 180 may be formed of a metal nitride film such as a titanium nitride film (TiN), a titanium silicon nitride film (TiSiN), a titanium aluminum nitride film (TiAlN), a tantalum nitride film (TaN), a tantalum silicon nitride film (TaSiN), a tantalum aluminum nitride film (TaAlN) and a tungsten nitride film (WN). Also, the upper electrode 180 may be formed of at least one noble metal film selected from the group consisting of platinum (Pt), ruthenium (Ru) and iridium (Ir). The upper electrode 180 may also be formed of a conductive noble metal oxide film such as PtO, $RuO_2$ or $IrO_2$ and a conductive oxide film such as $SRO(SrRuO_3)$, $BSRO((Ba, Sr)RuO_3)$, CRO $((CaRuO_3)$ or LSCo.

After depositing the upper electrode 180, a plasma process and a thermal annealing process for removing impurities generated when the upper conductive film is deposited may be performed. When performing a plasma process, $N_2$ plasma and $H_2$ plasma may be used.

Figure 6:
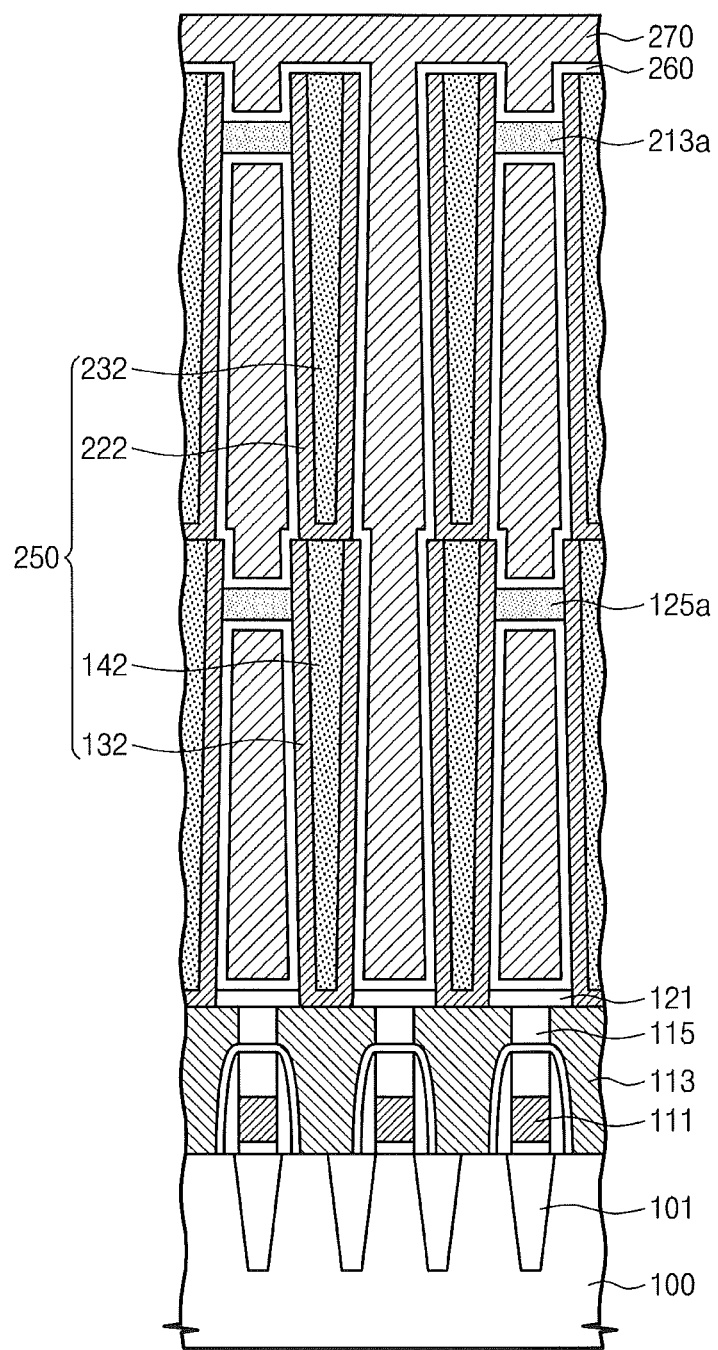
FIG. 6 is a cross section illustrating a semiconductor device in accordance with some embodiments of the inventive concept, which is taken along the line I-I' of FIG. 1.

FIG. 6 is a cross section taken along the line I-I' of FIG. 1 illustrating a semiconductor device in accordance with some embodiments of the inventive concept. As discussed above, like reference numerals refer to like elements throughout. Accordingly, details discussed above with respect to these elements may not be repeated herein. Referring to FIG. 6, a lower electrode 250 of multilayer structure may be used as a capacitor of semiconductor device in accordance with the second embodiment. As the lower electrode 250 is formed to have a multilayer structure, a surface area of the lower electrode 250 increases, thereby increasing capacitance of a capacitor.

The lower electrode 250 formed on each of the contact plugs 113 may include a first conductive pattern 132, a first core support pattern 142, a second conductive pattern 222 and a second core support pattern 232. The lower electrode 250 of multilayer structure may have a structure such that the first and second conductive patterns 132 and 142 are vertically stacked and first and second core support patterns 142 and 232 are vertically stacked. Herein, a bottom portion of the second conductive pattern 222 may be interposed between the first and second core support pattern 142 and 232.

More specifically, the first conductive pattern 132, as described in the first embodiment, may have a cylindrical shape having a bottom portion and a sidewall portion that define a groove region. As illustrated in FIG. 1, the first conductive patterns 132 of a cylindrical shape may be horizontally connected to one another by the first support pattern 125a formed of an insulating material.

According to some embodiments, the first core support pattern 142 may fully fill the groove region of the first conductive pattern 132. The first core support pattern 142, as described in the first embodiment, may be formed of a material having superior stiffness, i.e., mechanical strength, as compared with the first conductive pattern 132. That is, the first core support pattern 142 may be formed of material having an elastic modulus larger than the first conductive pattern 132. For example, the first core support pattern 142 may be formed of material having Young's modulus of about 300 Gpa through 1000 Gpa.

The second conductive pattern 222 may also have may have a cylindrical shape having a bottom portion and a sidewall portion that define a groove region and may be directly in contact with top surfaces of the first conductive pattern 132 and the first core support pattern 142. That is, the second conductive pattern 222 may be electrically connected to the first conductive pattern 132. The second conductive patterns 222 of a cylindrical shape may be horizontally connected to one another by a second support pattern 213a formed of an insulating material.

The second core support pattern 232 may be formed in the groove region of the second conductive pattern 222. In this embodiment, the second core support pattern 232 may be formed of material having an elastic modulus larger than the second conductive pattern 222 and may have Young's modulus of about 300 Gpa through 1000 Gpa. The second core support pattern 232 may be formed of the same material as the first core support pattern 142. Also, the second core support pattern 232 may fully fill the groove region of the second conductive pattern 222.

In some embodiments, since the groove regions of the first and second conductive patterns 132 and 222 are filled with the first and second core support patterns 142 and 232, a dielectric film 260 may be formed on outer sidewalls of the first and second conductive patterns 132 and 222 at a uniform thickness. The dielectric film 260 may be in contact with an upper surface of the second core support pattern 232. An upper electrode 270 covering the plurality of lower electrodes 250 may be formed on the dielectric film 260. A barrier pattern that can reduce or, possibly minimize, a diffusion of metal atoms may be formed between the second core support pattern 232 and the dielectric film 260. That is, the barrier film may reduce the likelihood or, possibly prevent, the dielectric film 260 from being deteriorated by the metal atoms when the second core support pattern 232 includes the metal atoms.

Figure 7:
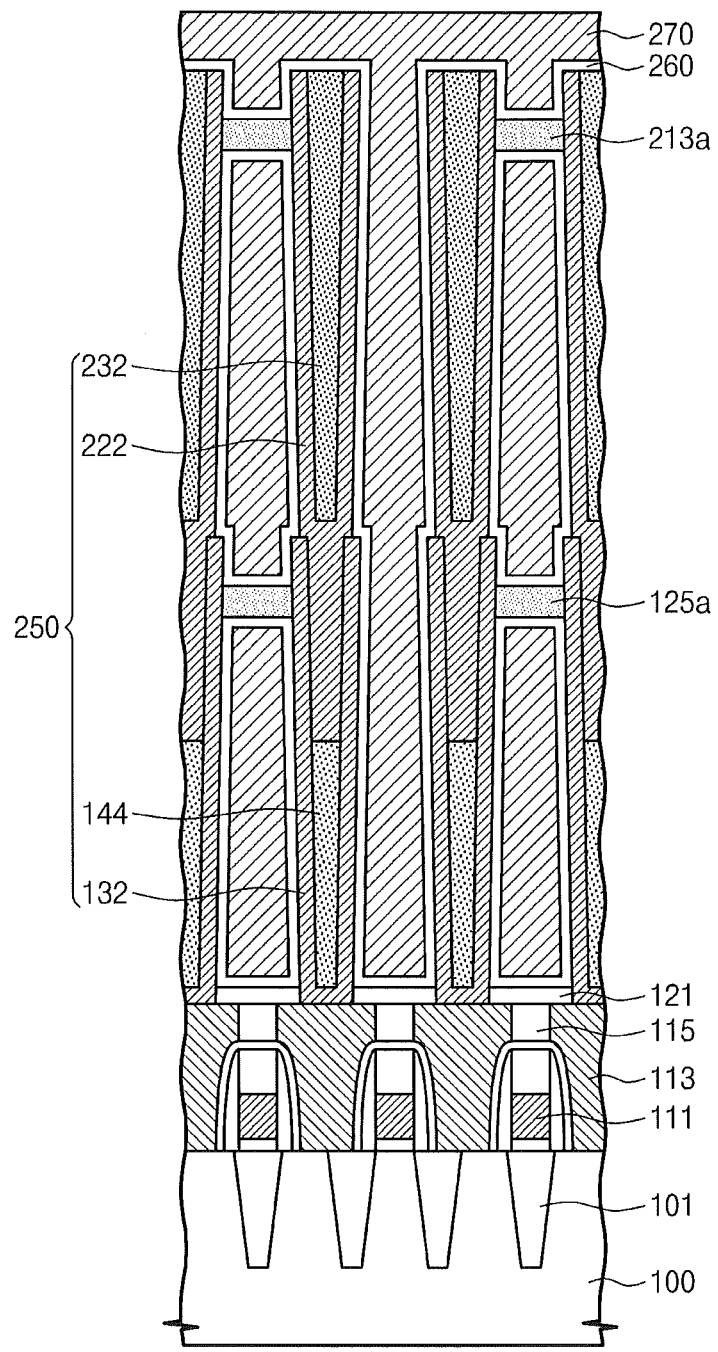
FIGS. 7 through 9 are cross sections illustrating semiconductor devices in accordance with some embodiments of the present inventive concept.
Figure 8:
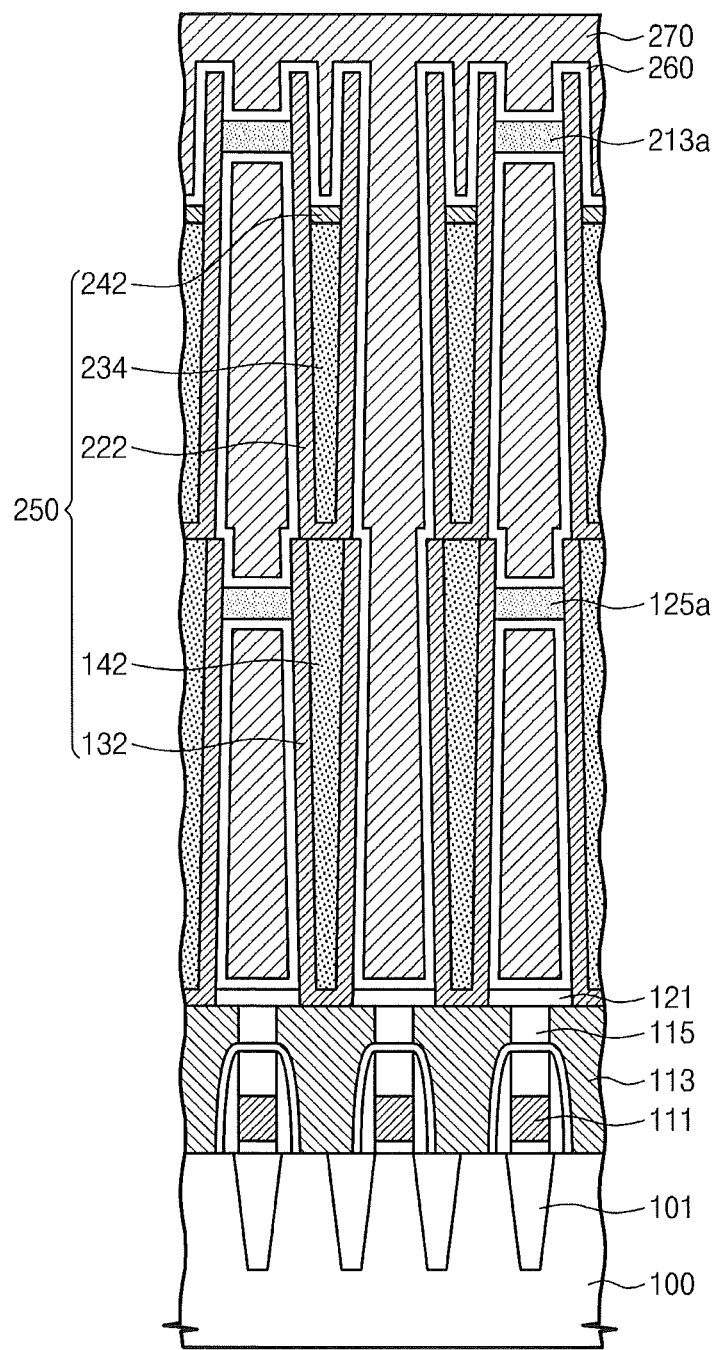
Figure 9:
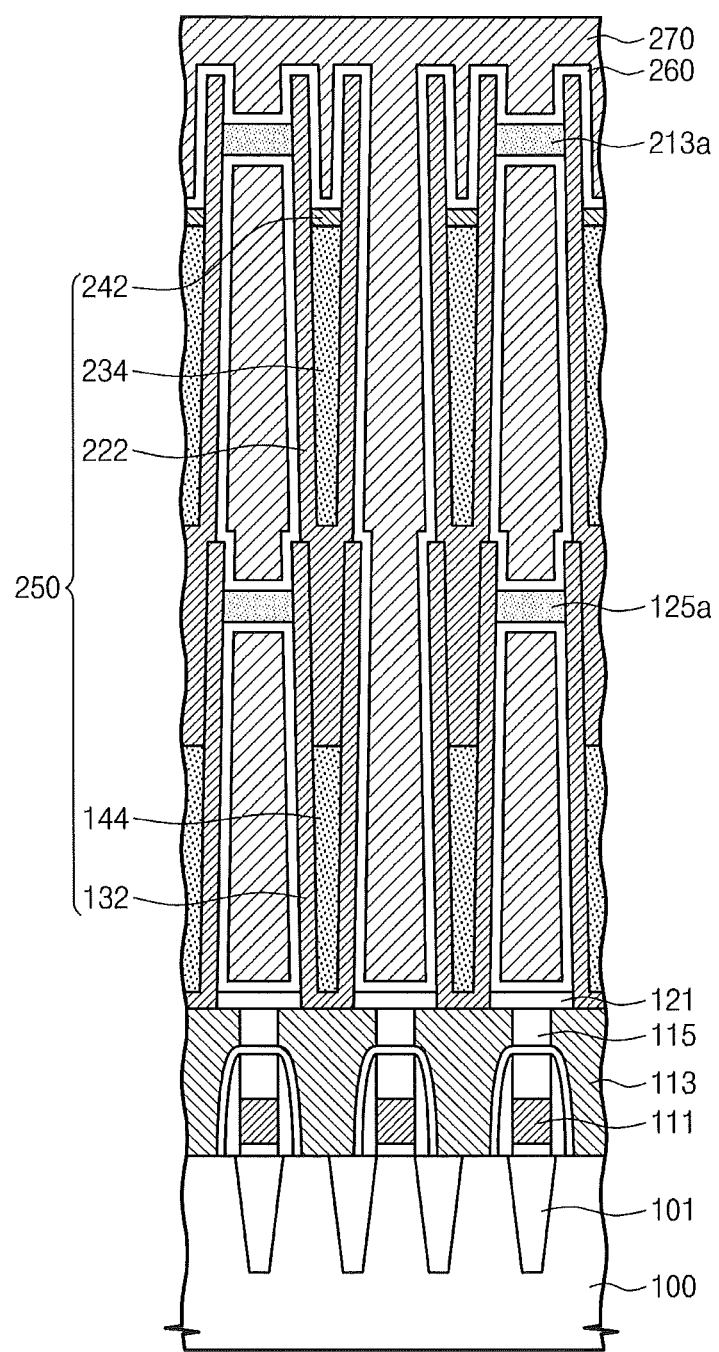

FIGS. 7 through 9 are cross sections illustrating some embodiments of the present inventive concept. According to embodiments of the present inventive concept illustrated in FIG. 7, the lower electrode 250 may include the first conductive pattern 132, a first core support pattern 144, the second conductive pattern 222 and the second core support pattern 232. Herein, the first conductive pattern 132 may have a cylindrical shape having a bottom portion and a sidewall portion that define a groove region.

In some embodiments, the first core support pattern 144 may fill a portion of a groove region of the first conductive pattern 132. That is, an upper surface of the first core support pattern 144 may be located to be lower than an upper surface of the first conductive pattern 132. For example, a vertical height of the first core support pattern 144 may be 0.5 to 1 times the vertical height of the first conductive pattern 132.

The second conductive pattern 222 may have a cylindrical shape having a bottom portion and a sidewall portion that define a groove region and a lower portion of the second conductive pattern 222 may be inserted into the groove region of the first conductive pattern 132. That is, a portion of outer sidewall of the second conductive pattern 222 may be directly in contact with an inner sidewall of the first conductive pattern 132. As the second conductive pattern 222 is inserted into the inside of the first conductive pattern 132, after first and second mold layers 120a and 150a are removed, the second conductive pattern 222 may not collapse on the first conductive pattern 132. That is, the lower electrode 250 of capacitor may not be bent or broken at a position where the first conductive pattern 132 is in contact with the second conducive pattern 222.

The second core support pattern 232 may be formed of a material having a large elastic modulus and may fully fill the groove region of the second conductive pattern 222. For example, the second conductive pattern 222 may be formed of titanium nitride and the second core support pattern may be formed of tungsten.

According to embodiments of the present inventive concept illustrated in FIG. 8, an upper surface of a second core support pattern 234 formed in a groove region of the second conductive pattern 222 may be located to be lower than an upper surface of the second conductive pattern 222. That is, a portion of inner sidewall of the second conductive pattern 222 may be exposed by the second core support pattern 232. Thus, a surface area of the lower electrode 250 that is in contact with the dielectric film 260 may increase.

A barrier pattern 242 formed of metal nitride may be interposed between the second core support pattern 232 and the dielectric film 260.

According to embodiments of the present inventive concept illustrated in FIG. 9, the lower electrode 250 may include first and second conductive patterns 132 and 222 and first and second core support patterns 144 and 232. Herein, the first core support pattern 144 may fill a portion of groove region of the first conductive pattern 132 and the second core support pattern 234 may fill a portion of groove region of the second conductive pattern 222. The second conductive pattern 222 may be directly in contact with an inner sidewall of the first conductive pattern 132 on the first core support pattern 144. Also, a barrier pattern 242 formed of metal nitride may be interposed between the second core support pattern 234 and the dielectric film 260.

Figure 10A:
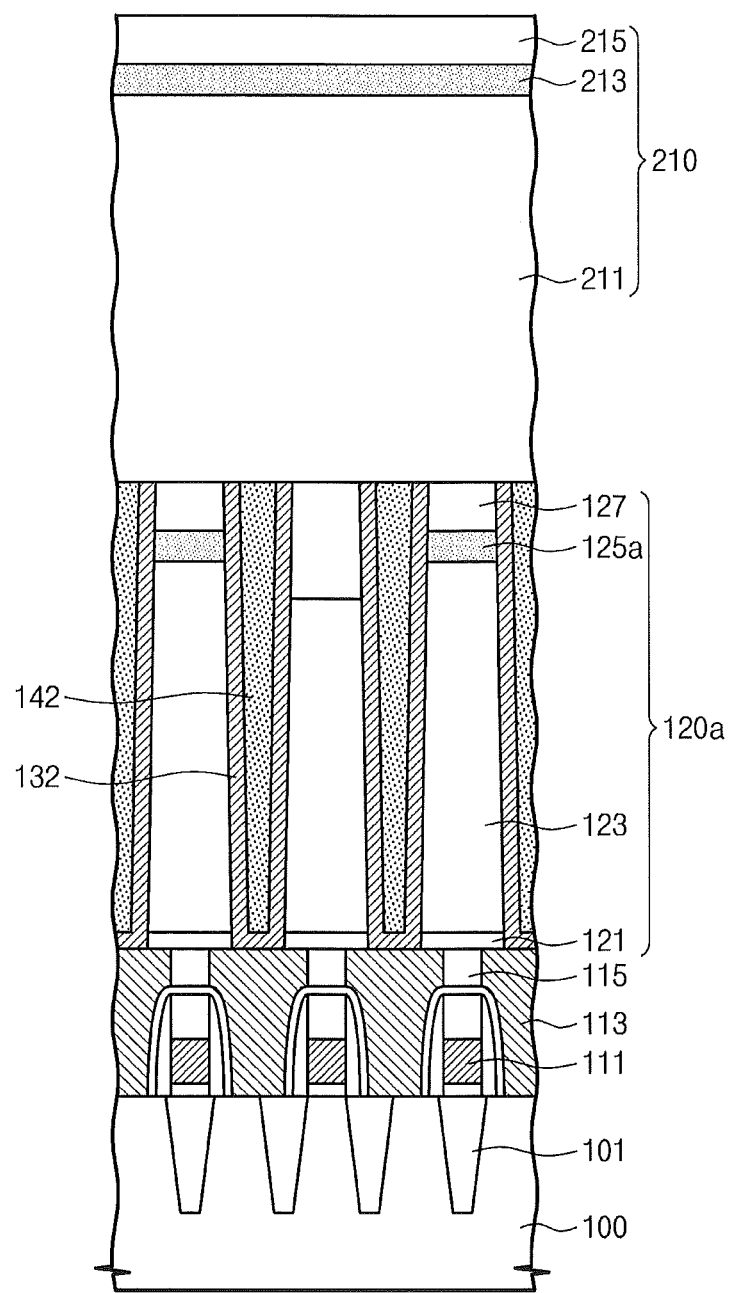
FIGS. 10A through 10G are cross sections illustrating processing steps in the fabrication of semiconductor devices in accordance with some embodiments of the inventive concept.

FIGS. 10A through 10G are cross sections illustrating processing steps in the fabrication of semiconductor devices in accordance with the second embodiment of the inventive concept. Hereinafter, some embodiments of the present inventive concept will be discussed with reference to FIGS. 10A through 10G. As discussed above, like reference numerals refer to like elements throughout the specification. Thus, details of elements discussed above may not repeated herein in the interest of brevity. Referring to FIG. 10A, a second mold layer 210 is formed on the first mold layer 120a in which the first conductive patterns 132 and the first core support patterns 142 are formed.

According to some embodiments, the second mold layer 210 may have a thickness of from about 5000 Å to about 21,000 Å. The second mold layer 210 may include of a lower insulating film 211, a second support film 213 and an upper insulating film 215, similar to the first mold layer 120a. Also, the lower and upper insulating films 211 and 215 may be formed of a silicon oxide film and the second support film 213 may be formed of a silicon nitride film, similar to the first mold layer 120a. According to another embodiment, the second support film 213 may be omitted and the second mold layer 210 may be composed of one or a plurality of insulating films.

Figure 10B:
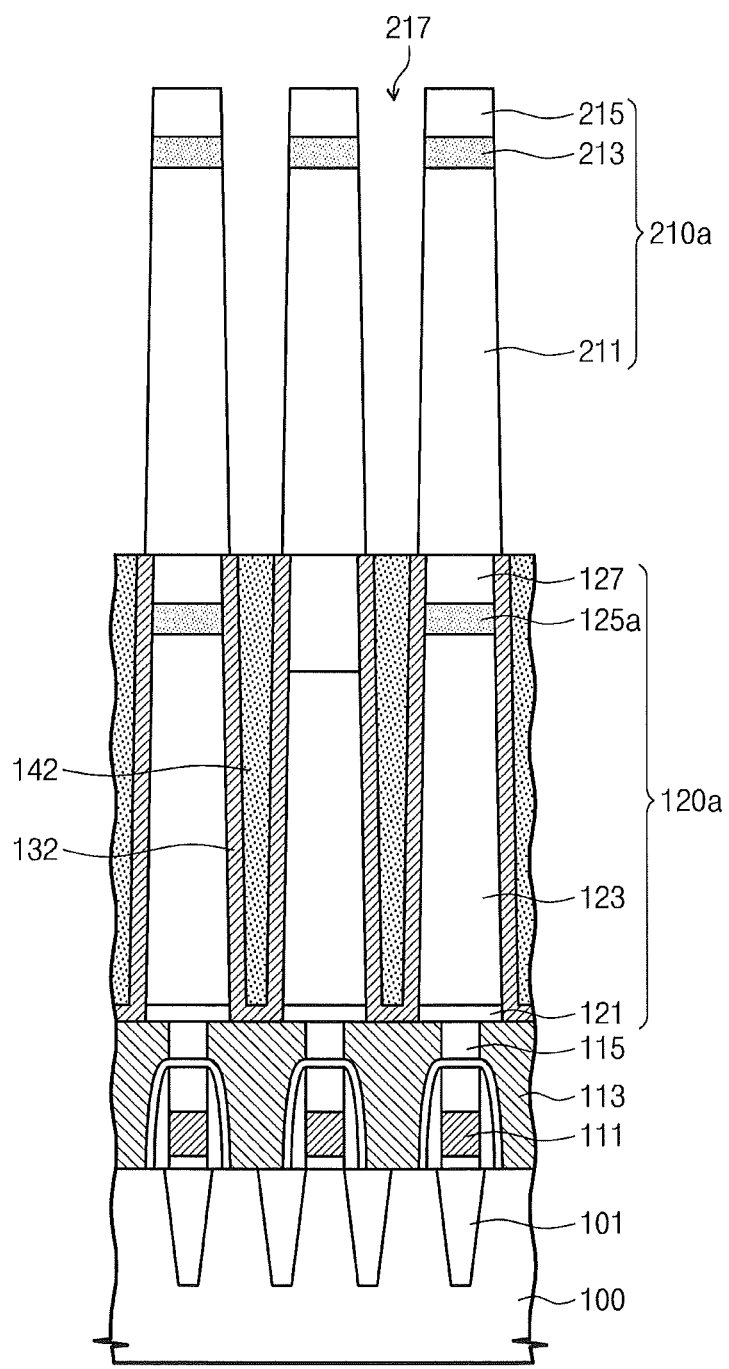

Referring to FIG. 10B, the second mold layer 210 is patterned to form second openings 217 exposing the first conductive pattern 132 and the first core support pattern 142. The second openings 217 may be formed by anisotropically etching the second mold layer 210 using the same mask as a hard mask pattern for forming the first openings (129 of FIG. 5B) discussed above with reference to FIG. 5B as an etching mask. By the anisotropic etching process, the second openings 217 may have a gradually narrowing width as the second openings 217 approach a lower portion.

In some embodiments, an etching process to form the second openings 217, as illustrated in FIG. 10B, may expose top surfaces of the first conductive pattern 132 and the first core support pattern 142.

Figure 10C:
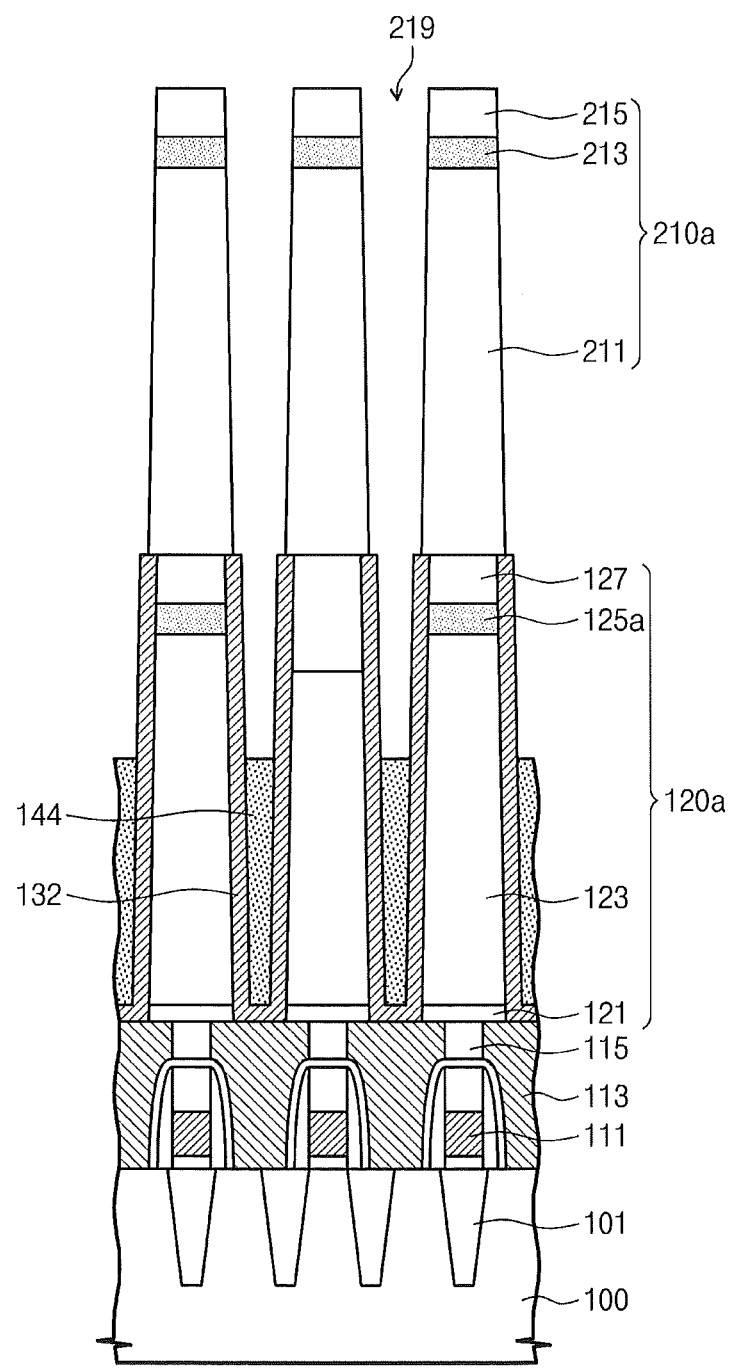

In further embodiments, after exposing the top surfaces of the first conductive pattern 132 and the first core support pattern 142, as illustrated in FIG. 10C, an upper surface of the first core support pattern 142 exposed by the second openings 219 may be recessed to a predetermined depth. More specifically, the top surface of the first core support pattern 142 may be recessed by anisotropically or isotropically etching the first core support pattern 142 using a recipe having an etching selectivity with respect to the first and second mold layers 120a and 210a and the first conductive pattern 132. As an upper surface of the first core support pattern 142 is recessed, the second opening 219 may expose an upper surface of the first conductive pattern 132 and a portion of an inner sidewall of the first conducive pattern 132. As an upper surface of the first core support pattern 142 is recessed, the first core support pattern 142 may fill a portion of a groove region of the first conductive pattern 132. Herein, a height of the first core support pattern 142 may be half a height of the first conductive pattern 132 or more.

Figure 10D:
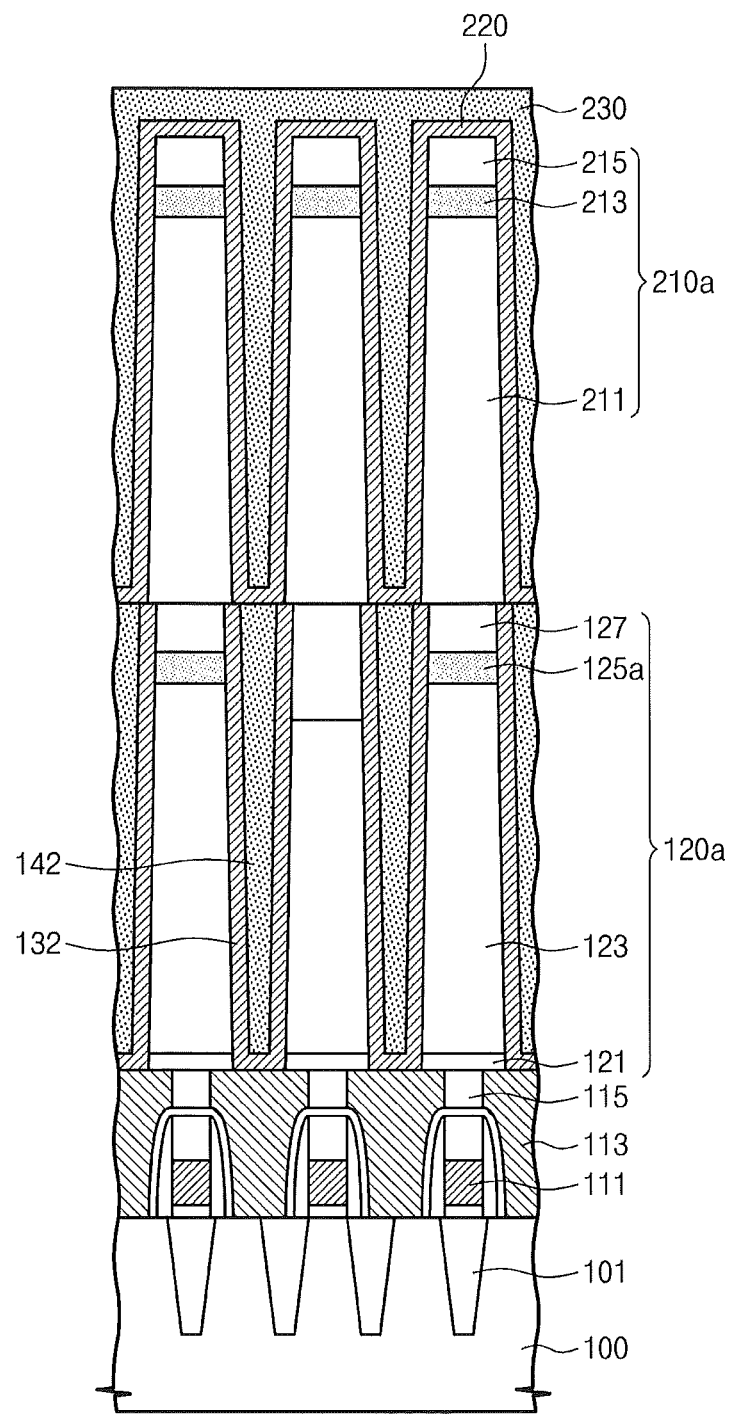
Figure 10E:
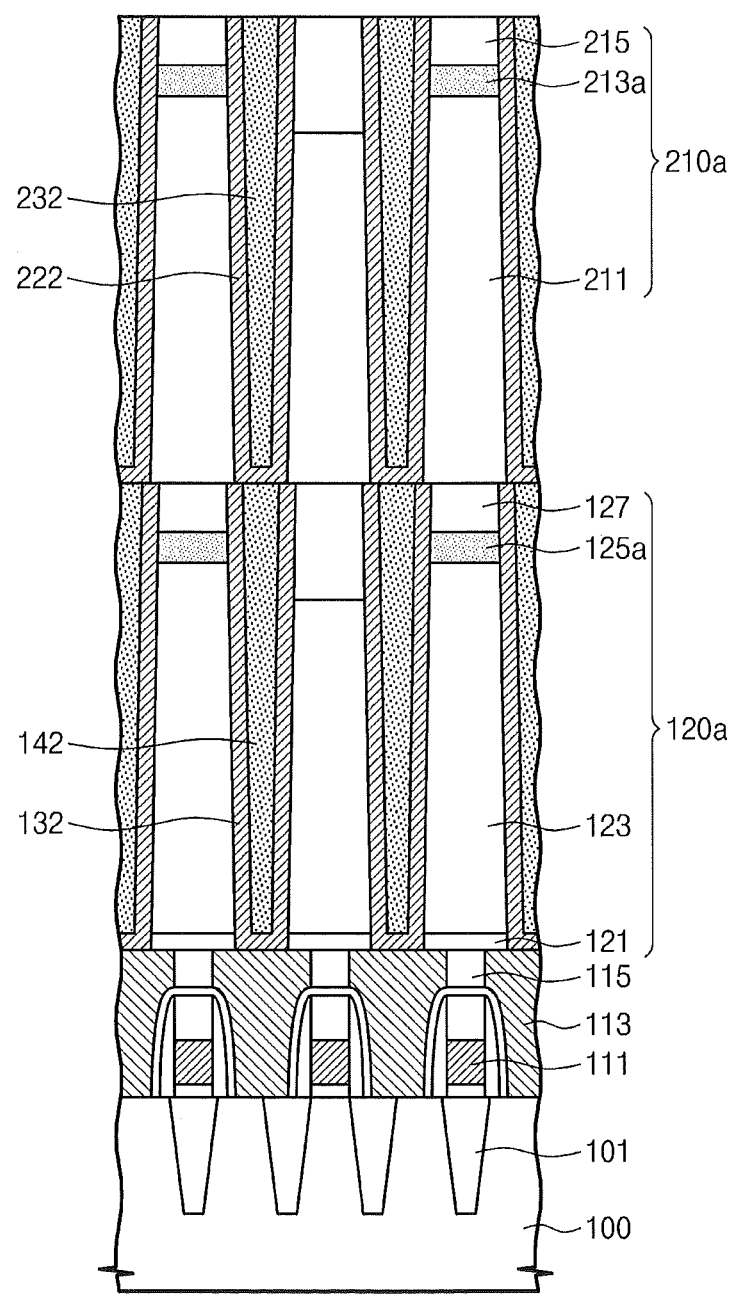

Referring to FIGS. 10D and 10E following FIG. 10B, a second conductive pattern 222 and a second core support pattern 232 are formed in each of the second openings 217. The second conductive pattern 222 and the second core support pattern 232, as described with reference to FIGS. 5D and 5E, may be formed by sequentially depositing a second conductive film 230 and a second core support film 240 on the second mold layer 210a in which the second openings 217 are formed, and then planarizing the second conductive film 230 and the second core support film 240. According to some embodiments, the second conductive film 230 may be conformally deposited while filling a portion of the second openings 217. The second conductive film 230 may be directly deposited on top surfaces of the first conductive pattern 132 and the first core support pattern 142 exposed by the second openings 217. The second conductive film 230 may be deposited at a thickness of half a diameter of the second opening 217 or less and a groove region may be defined in the second opening 217 by the second conductive film 230.

The second conductive film 230 may include at least one among silicon doped with an impurity, metal materials, metal nitrides and metal silicides. For example, the second conductive film 230 may be formed of a refractory metal film such as cobalt, titanium, nickel, tungsten and molybdenum. The second conductive film 230 may be formed of at least one metal nitride film selected from the group consisting of a titanium nitride film (TiN), a titanium silicon nitride film (TiSiN), a titanium aluminum nitride film (TiAlN), a tantalum nitride film (TaN), a tantalum silicon nitride film (TaSiN), a tantalum aluminum nitride film (TaAlN) and a tungsten nitride film (WN). Also, the second conductive film 230 may be formed of at least one noble metal film selected from the group consisting of platinum (Pt), ruthenium (Ru) and iridium (Ir). The second conductive film 230 may also be formed of a conductive noble metal oxide film such as PtO, $RuO_2$ or $IrO_2$ and a conductive oxide film such as $SRO(SrRuO_3)$, $BSRO((Ba, Sr)RuO_3)$, $CRO((CaRuO_3)$ or LSCo.

After depositing the second conductive film 230, a plasma process and a thermal annealing process for removing impurities generated when the second conductive film 230 is deposited may be performed. When performing a plasma process, $N_2$ plasma and $H_2$ plasma may be used.

The second core support film 240, as described with reference to FIG. 5D, may be formed of material having an elastic modulus larger than the second conductive film 230 and an etching selectivity with respect to the second consecutive film 230. The second core support film 240 having superior stiffness, i.e., mechanical strength, as compared with the second conductive film 230 may be formed of material having Young's modulus of about 300 Gpa through 1000 Gpa. For example, the second core support film 240 may be formed of at least one selected from the group consisting of tungsten (W), iridium (Ir), ruthenium (Ru), aluminum oxide ($Al_{2O33}$), ruthenium oxide ($RuO_2$) or combinations thereof.

Subsequently, the second conductive film 230 and the second core support film 240 may be planarized down to an upper surface of the second mold layer 210a and thereby, as illustrated in FIG. 10E, the second conductive pattern 222 and the second core support pattern 232 may be formed in each of the second openings 217. The second conductive pattern 222 may have a bottom portion and a sidewall portion that define a groove region and the second core support pattern 232 may fill the groove region.

After forming the second conductive patterns 222, similar to form the first support pattern 125a described with reference to FIG. 5E, a second support pattern 213a may be formed by patterning the second support film 213. That is, the second support pattern 213a exposing a lower insulating film 211 of the second mold layer 210a while surrounding a portion of or the whole outer sidewall of the second conductive patterns 222 may be formed. Further, after forming the second support pattern 213a, an insulating film may be formed on the lower insulating film 211 exposed between the second conductive patterns 222.

Figure 10F:
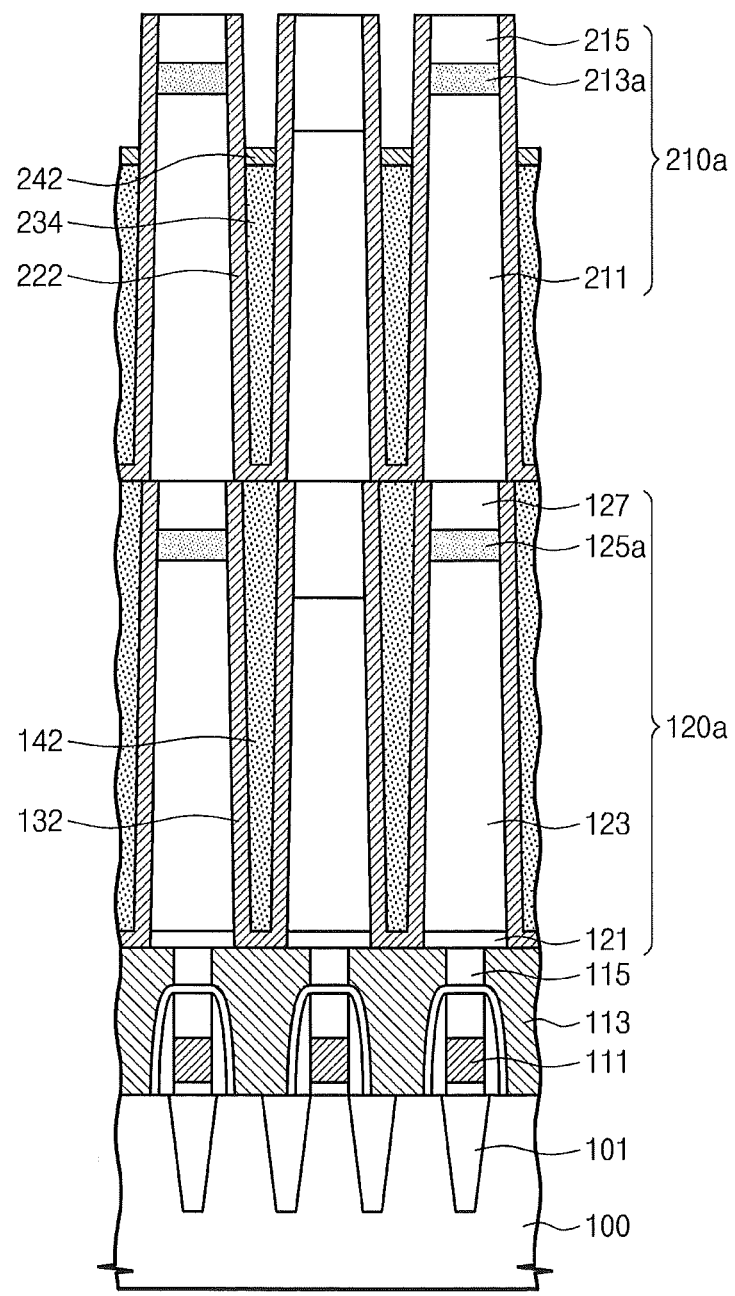

According to some embodiments, as illustrated in FIG. 10F, an upper surface of the second core support pattern 232 filling the groove region of the second conductive pattern 222 may be recessed. As described with reference to FIG. 5F, the recessed second core support pattern 234 may expose a portion of an inner sidewall of the second conductive pattern 222. Herein, a recess depth of the second core support pattern 234 may be half a vertical height of the second conductive pattern 222 or less to reduce the likelihood or, possibly prevent, the second conductive pattern 222 from being bent. As described with reference to FIGS. 5G and 5H, a barrier pattern 242 reducing the likelihood or, possibly preventing, a diffusion of metal atoms may be formed on an upper surface of the recessed second core support pattern 234.

Figure 10G:
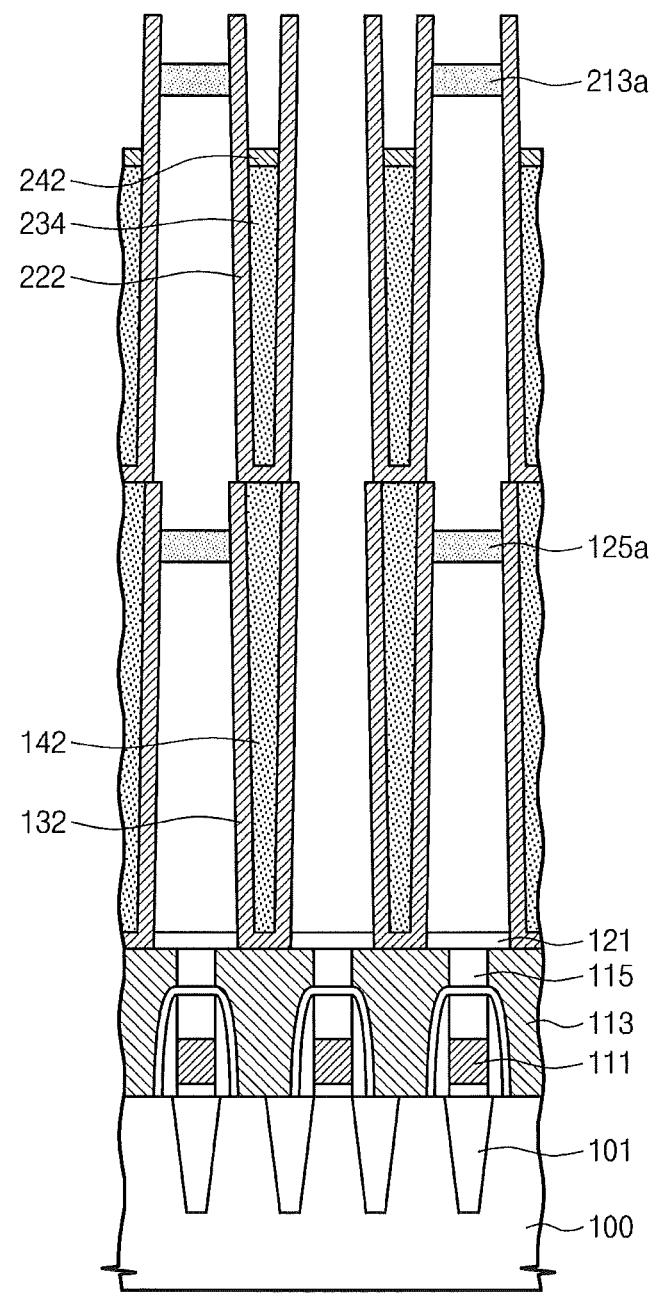

Referring to FIG. 10G, a process of selectively removing the first and second mold layers 120a and 210a may be performed. Outer sidewalls of the first and second conductive patterns 132 and 222 may be exposed by removing the first and second mold layers 120a and 210a. When removing the first and second mold layers 120a and 210a, the first and second support patterns 125a and 213 a having an etching selectivity may remain without being removed. Thus, the adjacent first conductive patterns 132 may be connected to each other by the first support pattern 125a and the adjacent second conductive patterns 222 may be connected to each other by the second support pattern 213a.

As illustrated in FIGS. 6 through 9, a dielectric film 260 and an upper electrode 270 may be sequentially formed on the lower electrodes of multilayer structure. In embodiments where the second core support pattern 232 is not recessed, as illustrated in FIG. 6, the dielectric film 260 may conformally cover outer sidewalls of the first and second conductive patterns 132 and 222 and an upper surface of the second core support pattern 232. In embodiments where the second core support pattern 234 is recessed, as illustrated in FIG. 8, the dielectric film 260 may cover a portion of inner sidewall of the second conductive pattern 222.

According to embodiments of the inventive concept, by forming a core support pattern having a superior stiffness in a lower electrode of cylindrical shape, the lower electrode may be prevented from being bent due to an increase of height of capacitor. Also, by forming the core support pattern to fill a portion of groove region of the lower electrode, a surface area of the lower electrode increases, thereby increasing capacitance.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A capacitor of a semiconductor device comprising:
a lower electrode on a semiconductor substrate;
a dielectric film covering a surface of the lower electrode; and
an upper electrode covering the dielectric film, wherein the lower electrode comprises:
a first conductive pattern having a groove region defined by a bottom portion and an inner sidewall portion of the first conductive pattern, a width of the groove region increasing from the bottom portion of the first conductive pattern to a top portion of the first conductive pattern; and
a first core support pattern in the groove region of the first conductive pattern to provide vertical support for the first conductive pattern such that a portion of the inner sidewall portion of the first conductive pattern is free of the first core support pattern leaving an exposed portion of the inner sidewall portion of the first conductive pattern.

2. The capacitor of claim 1:
wherein the first core support pattern has an etching selectivity with respect to the first conductive pattern; and
wherein the first core support pattern includes a material having an elastic modulus greater than the first conductive pattern.

3. The capacitor of claim 1, wherein the first core support pattern includes a material having young's modulus of 300 Gpa through 1000 Gpa.

4. The capacitor of claim 3, wherein the first core support pattern is includes at least one selected from the group consisting of tungsten (W), iridium (Ir), ruthenium (Ru), aluminum oxide ($Al_2O_3$), ruthenium oxide ($RuO_2$).

5. The capacitor of claim 1:
wherein the lower electrode further comprises a barrier pattern between the dielectric film and the first core support pattern; and
wherein the first core support pattern comprises a metal material and the barrier pattern comprises a conductive metal nitride.

6. The capacitor of claim 1, wherein a vertical height of the first core support pattern is from about 0.5 to about 1.0 times a vertical height of the first conductive pattern.

7. The capacitor of claim 1, wherein the dielectric film conformally covers the exposed portion of the inner sidewall of the first conductive pattern.

8. The capacitor of claim 1, wherein the lower electrode further comprises a second conductive pattern electrically connected to the first conductive pattern on the first core support pattern.

9. The capacitor of claim 8, wherein the second conductive pattern is directly in contact with an inner sidewall of the first conductive pattern exposed by the first core support pattern.

10. The capacitor of claim 8:
wherein the second conductive pattern has a groove region defined by a bottom portion and a sidewall portion; and
wherein the lower electrode further comprises a second core support pattern in the groove region of the second conductive pattern.

11. The capacitor of claim 10, wherein the second core support pattern has an etching selectivity with respect to the second conductive pattern and is formed of a material having an elastic modulus greater than the second conductive pattern.

12. The capacitor of claim 10, wherein the second core support pattern exposes a portion of inner sidewall of the second conductive pattern in the groove region of the second conductive pattern.

13. The capacitor of claim 10, wherein the second core support pattern is spaced apart from the first core support pattern by the bottom portion of the second conductive pattern.

14. A capacitor of a semiconductor device comprising:
a lower electrode on a semiconductor substrate;
a dielectric film covering a surface of the lower electrode;
an upper electrode covering the dielectric film, wherein the lower electrode comprises:
a first conductive pattern having a groove region defined by a bottom portion and a sidewall portion;
a first core support pattern filling the groove region of the first conductive pattern;
a second conductive pattern on the first conductive pattern and the first core support pattern and having a groove region defined by a bottom portion and an inner sidewall portion of the second conductive pattern, a width of the groove region increasing from the bottom portion of the second conductive pattern to a top portion of the second conductive pattern; and
a second core support pattern in the groove region of the second conductive pattern to provide vertical support for the first conductive pattern such that a portion of the inner sidewall portion of the second conductive pattern is free of the first core support pattern leaving an exposed portion of the inner sidewall portion.

15. The capacitor of claim 14, wherein the first and second core support patterns include a material having an elastic modulus greater than the first and second conductive patterns.

16. The capacitor of claim 1, wherein the first conductive pattern extends vertically from a semiconductor substrate and wherein a vertical height of the first conductive pattern extends from about 5000 Å to about 15,000 Å away from the semiconductor substrate.

17. The capacitor of claim 1, further comprising a horizontal support pattern adjacent the exposed portion of the inner sidewall of the first conductive pattern to support the electrode horizontally.

18. The capacitor of claim 17, wherein the horizontal support pattern surrounds the lower electrodes.

* * * * *